United States Patent
Choi et al.

(10) Patent No.: US 11,217,318 B2
(45) Date of Patent: Jan. 4, 2022

(54) NON-VOLATILE MEMORY DEVICE AND PROGRAM METHOD OF A NON-VOLATILE MEMORY DEVICE

(71) Applicants: Chang-Min Choi, Seoul (KR); Bong-Yong Lee, Suwon-si (KR); Dong-Chan Kim, Seoul (KR); Su-Jin Ahn, Seoul (KR)

(72) Inventors: Chang-Min Choi, Seoul (KR); Bong-Yong Lee, Suwon-si (KR); Dong-Chan Kim, Seoul (KR); Su-Jin Ahn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/405,346

(22) Filed: Jan. 13, 2017

(65) Prior Publication Data
US 2021/0335431 A1 Oct. 28, 2021

(30) Foreign Application Priority Data
Jan. 15, 2016 (KR) .................. 10-2016-0005322

(51) Int. Cl.
*G11C 16/34* (2006.01)
*G11C 16/10* (2006.01)
(Continued)

(52) U.S. Cl.
CPC .......... *G11C 16/3454* (2013.01); *G11C 16/08* (2013.01); *G11C 16/102* (2013.01);
(Continued)

(58) Field of Classification Search
CPC ... G11C 16/3454; G11C 16/08; G11C 16/102; G11C 16/28; G11C 16/30; G11C 16/32; G11C 16/3404
See application file for complete search history.

(56) References Cited

U.S. PATENT DOCUMENTS 7,439,263 B2  3/2008  Kim et al.
7,646,639 B2  1/2010  Lee et al.
(Continued)

FOREIGN PATENT DOCUMENTS

CN    101711414 A    5/2010
KR    20080061937 A  7/2008
(Continued)

OTHER PUBLICATIONS

Chinese Office Action dated Nov. 12, 2021, Cited in CN Patent Application No. 201710032688.5.

*Primary Examiner* — Han Yang
(74) *Attorney, Agent, or Firm* — Volentine, Whitt & Francos, PLLC

(57) ABSTRACT

A method of programming a non-volatile memory includes executing at least two program loops on memory cells in a selected word line, generating a fail bit trend based on a result of executing each of the at least two program loops, predicting a plurality of program loops comprising an N program loop to be executed last on the memory cells, based on the generated fail bit trend, and changing, based on a result of predicting the plurality of program loops, a level of an N program voltage provided to the memory cells when the N program loop is executed.

20 Claims, 27 Drawing Sheets

(51) Int. Cl.
*G11C 16/32* (2006.01)
*G11C 16/30* (2006.01)
*G11C 16/08* (2006.01)
*G11C 16/28* (2006.01)

(52) U.S. Cl.
CPC .............. *G11C 16/28* (2013.01); *G11C 16/30* (2013.01); *G11C 16/32* (2013.01); *G11C 16/3404* (2013.01)

(56) References Cited

U.S. PATENT DOCUMENTS

| | | | |
|---|---|---|---|
| 7,889,592 B2 | 2/2011 | Kim | |
| 8,000,135 B1 | 8/2011 | Perlmutter et al. | |
| 8,305,804 B2 | 11/2012 | Kim et al. | |
| 8,339,864 B2 | 12/2012 | Park | |
| 8,345,477 B1 | 1/2013 | Yang | |
| 8,374,036 B2 | 2/2013 | Jeong et al. | |
| 8,374,063 B2 | 2/2013 | Jeong et al. | |
| 9,070,460 B2 | 6/2015 | Yano | |
| 9,076,534 B2 | 7/2015 | Yoon et al. | |
| 2010/2734220 | 9/2004 | Micheloni et al. | |
| 2008/0062770 A1 | 3/2008 | Tu et al. | |
| 2010/0027336 A1* | 2/2010 | Park | G11C 16/10 365/185.09 |
| 2010/0027342 A1 | 2/2010 | Eun et al. | |
| 2011/0122704 A1* | 5/2011 | Park | G11C 16/3459 365/185.19 |
| 2014/0025866 A1 | 1/2014 | Kim et al. | |

FOREIGN PATENT DOCUMENTS

| | | |
|---|---|---|
| KR | 100909961 B1 | 7/2009 |
| KR | 20100054705 A | 5/2010 |
| KR | 20100056860 A | 5/2010 |
| KR | 20100088913 A | 8/2010 |
| KR | 20110001101 A | 1/2011 |

* cited by examiner

FIG. 10
(a) L Loop
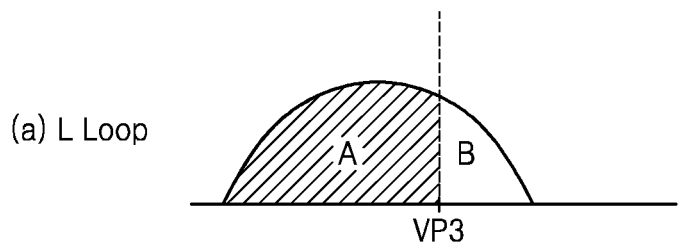
(b) L+1 Loop
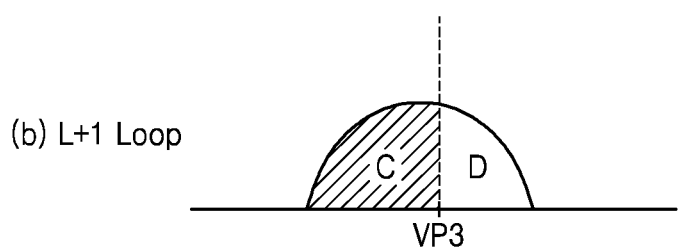
(b) L+2 Loop
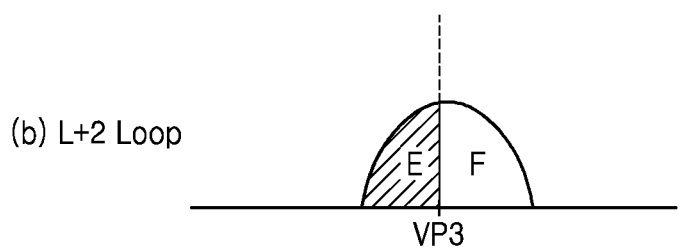
▨ : FAIL BIT
☐ : PASS BIT

FIG. 15A

| FAIL BIT RANGE | VOLTAGE CHANGE LEVEL |
|---|---|
| FIRST RANGE (R1) | $L_1(V)$ |
| ⋮ | ⋮ |
| k RANGE (Rk) | $L_k(V)$ |

PVLT_Table

FIG. 15B

| FAIL BIT RANGE | VOLTAGE CHANGE LEVEL |
| --- | --- |
| EQUAL TO OR GREATER THAN 60% (R1) | 0 (V) |
| EQUAL TO OR GREATER THAN 40% BUT LESS THAN 60% (R2) | −0.1 (V) |
| LESS THAN 40% (R3) | −0.2 (V) |

PVLT_Table

NON-VOLATILE MEMORY DEVICE AND PROGRAM METHOD OF A NON-VOLATILE MEMORY DEVICE

CROSS-REFERENCE TO RELATED APPLICATION

This application claims the benefit of priority under 35 U.S.C. § 119 to Korean Patent Application No. 10-2016-0005322, filed on Jan. 15, 2016, in the Korean Intellectual Property Office, the disclosure of which is incorporated herein in its entirety by reference.

BACKGROUND

Field of the Disclosure

The present disclosure relates to a memory device. More particularly, the present disclosure relates to a non-volatile memory device and a method of programming the non-volatile memory device.

Background Information

Memory devices are used to store data and are classified into volatile memory devices and non-volatile memory devices. A flash memory device that is an example of a non-volatile memory device may be used in a mobile phone, a digital camera, a personal digital assistant (PDA), a portable computer device, a fixed computer device, and the like. Also, when a program operation is performed on memory cells of the memory device by using an incremental step pulse program (ISPP) method, a disturbance between neighboring memory cells may be caused due to a program voltage. Thus, research has been actively conducted to solve the disturbance.

SUMMARY

The present disclosure describes a non-volatile memory device having improved reliability when a program operation is performed, and a method of programming the non-volatile memory device.

According to an aspect of the present disclosure, a method of programming a non-volatile memory includes executing at least two program loops on memory cells in a selected word line. The method includes generating a fail bit trend based on a result of executing each of the at least two program loops. The method also includes predicting multiple program loops including an N program loop to be executed last on the memory cells, based on the generated fail bit trend. The method further includes changing, based on a result of predicting the program loops, a level of an N program voltage provided to the memory cells when the N program loop is executed.

According to another aspect of the present disclosure, a non-volatile memory device includes a memory cell array including multiple memory cells that are targeted for program loop execution. Control logic is configured to execute multiple program loops on the memory cells. The control logic includes a fail bit trend generator configured to generate a fail bit trend based on results of executing at least two of the program loops that are executed on the memory cells. The program logic also includes a program loop prediction unit configured to predict the program loops to be executed on the memory cells based on the fail bit trend. The program logic further includes a program voltage level controller configured to change a level of a program voltage provided when a last program loop is executed on the memory cells, based on a result of predicting the program loops.

BRIEF DESCRIPTION OF THE DRAWINGS

Embodiments of the present disclosure will be more clearly understood from the following detailed description taken in conjunction with the accompanying drawings in which:

FIG. 10 shows diagrams of a method of generating a fail bit trend by a fail bit trend generator, according to an embodiment;

FIGS. 15A and 15B are tables showing voltage level changes according to an embodiment;

DETAILED DESCRIPTION OF THE EMBODIMENTS

Figure 1:
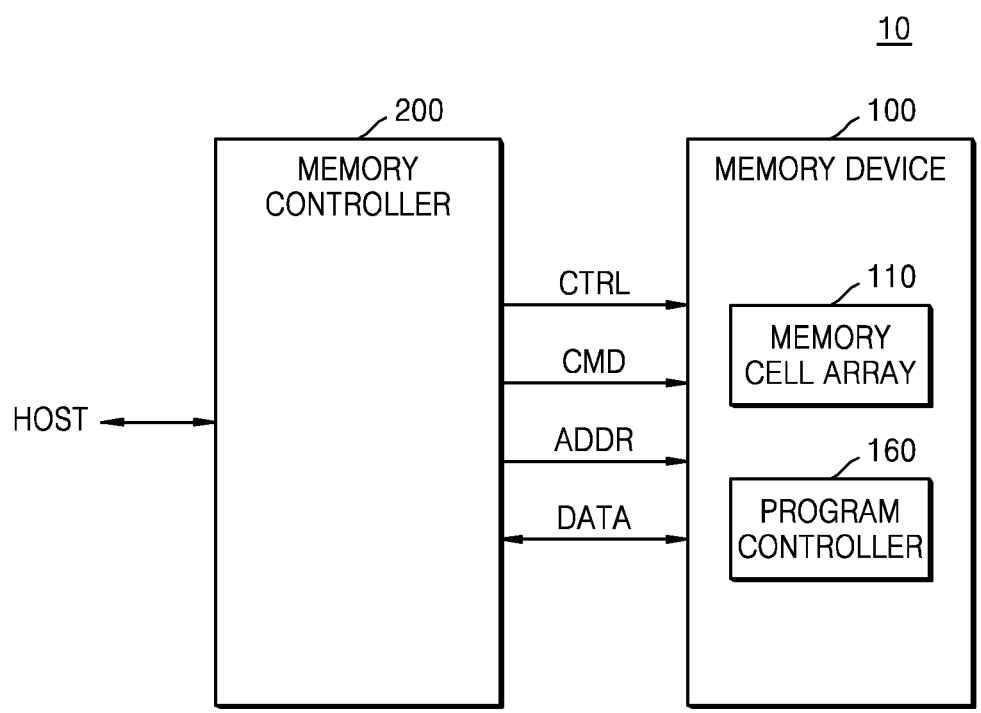
FIG. 1 is a schematic block diagram of a memory system according to an embodiment.

As the present disclosure allows for various changes and numerous embodiments, particular embodiments will be illustrated in the drawings and described in detail in the written description. However, this is not intended to limit the teachings of the present disclosure to particular modes of practice, and it is to be appreciated that all changes, equivalents, and substitutes that do not depart from the spirit and technical scope of the present disclosure are encompassed in the concepts described herein. In the drawings, like reference numerals in the drawings denote like elements.

It will be further understood that the terms "comprises" and/or "comprising" used herein specify the presence of stated features or components, but do not preclude the presence or addition of one or more other features or components. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items. For example, "A or B" may include either A or B or may include both A and B.

It will be understood that although the terms first and second are used herein to describe various elements, these elements should not be limited by these terms. For example, the terms do not limit orders and/or importance of the elements. These terms are only used to distinguish one element from another element. For example, a first user device and a second user device are all user devices and indicate different devices. For example, a first element discussed below could be termed a second element, and similarly, a second element may be termed a first element without departing from the teachings of this disclosure.

It will be understood that when an element or layer is referred to as being "connected to" or as "contacting" another element or layer, the element or layer can be directly connected to or contact another element or layer or intervening elements or layers. In contrast, when an element is referred to as being "directly connected to" or as "directly contacting" another element or layer, there are no intervening elements or layers present.

As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which the concepts described herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a memory system 10 according to an embodiment.

As shown in FIG. 1, the memory system 10 may include a memory device 100 and a memory controller 200. The memory device 100 may include a memory cell array 110, and a program controller 160.

The memory cell array 110 may include memory cells. For example, the memory cells may be flash memory cells. Hereinafter, the memory cells are NAND flash memory cells. However, the memory cell array 110 is not limited thereto. The memory cells may be NOR flash memory cells, and in other embodiments, the memory cells may be resistive memory cells such as resistive random access memory (RRAM), phase-change random access memory (PRAM), or magnetic random access memory (MRAM).

Memory cell arrays, memory cells and memory described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory cell array, memory cell, or memory described herein is an article of manufacture and/or machine component. Memory cell arrays, memory cells, and memories described herein are computer-readable mediums from which data and executable instructions can be read by a computer.

The memory cell array 110 may be a 3-dimensional (3D) memory cell array. The 3D memory cell array 110 may be a monolithic memory cell array where memory cells are arranged in at least one physical level. The memory cells may have active areas arranged on a silicon substrate and circuits related to operations of the memory cells and formed on or in the silicon substrate. The term "monolithic" indicates that layers of each level of the array are directly disposed on the layers of each underlying level of the array. The 3D memory cell array 110 includes NAND strings vertically arranged in such a manner that at least one memory cell is located above another memory cell. The at least one memory cell may include a charge trap layer. However, the memory cell array 110 is not limited thereto, and in another embodiment, the memory cell array 110 may be a 2D memory cell array.

In the present embodiment, each memory cell included in the memory cell array 110 may be a multi-level cell (MLC) in which data of 2 bits or more is stored. For example, the memory cell may be a multi-level cell in which 2-bit data is stored. As another example, the memory cell may be a triple level cell (TLC) in which 3-bit data is stored. However, the memory cells are not limited thereto. In another embodiment, some of the memory cells included in the memory cell array 110 may be single level cells (SLCs) in which 1-bit data is stored, and others thereof may be multi-level cells.

The program controller 160 may set an order of programming the memory cells in the memory cell array 110 and may control the number of data bits or a level of voltage. The program controller 160 may control the number of data bits which are stored in the memory cells when the memory cells are programmed in the set order. The program controller 160 may control a level of a voltage such as a program voltage or a verification voltage applied to the memory cells. The program controller 160 may control execution of program loops on the memory cells included in the memory cell array 110 overall. The program loop may include a program operation and a verification operation. In an embodiment, the program controller 160 may generate a fail bit trend based on results of respectively executing at least two of the program loops executed on the memory cells. In an embodiment, a fail bit corresponds to a memory cell with a low threshold voltage level, such as a threshold voltage level lower than a verification voltage level when a verification operation is performed. When the program loops are sequentially executed on the memory cells by using an incremental step pulse program (ISPP) method, a trend of a change in the number of such memory cells with low threshold voltage levels may be referred to as a fail bit trend. A fail bit trend indicates a trend of a change in the number of such memory cells having a threshold voltage level lower than a verification voltage level when a verification operation is performed on each program loop. However, the program controller 160 may not just generate the fail bit trend, but may also generate a pass bit trend. A pass bit trend indicates a trend of a change in the number of memory cells having a threshold voltage level higher than a verification voltage level when a verification operation is performed on each program loop. The program controller 160 may control a program voltage level of a last program loop based on the generated pass bit trend. Since generation of a pass bit trend is the same as generation of a fail bit trend in terms of the spirit of the present disclosure, the fail bit trend will be hereinafter described.

The program controller 160 may perform an operation of predicting program loops to be executed on the memory cells based on the fail bit trend. In an embodiment, the program controller 160 may predict program loops including a last program loop to be executed on the memory cells based on the fail bit trend. The prediction of the last program loop will be described below. Also, the program controller 160 may control a change in a level of a program voltage provided to the memory cells when the last program loop is executed based on a prediction result. For example, the program controller 160 may control a level of a step pulse voltage with respect to a voltage of the last program loop by controlling a voltage generator included in the memory device 100. A degree of the level of the voltage of the last program loop that is changed by the program controller 160 will be described below. However, the above description is merely an exemplary embodiment. The program controller 160 may predict a last program loop as well as certain program loops to be executed on memory cells and thus may change levels of program voltages of the predicted program loops.

The program controller 160 may predict program loops to be executed on the memory cells according to the fail bit trend. The program controller 160 may improve the reliability of a memory device 100 by changing, based on a prediction result, a level of a program voltage when the last program loop is executed.

The memory controller 200 may control the memory device 100 to read data stored in the memory device 100 or write data to the memory device 100 in response to a read/write request transmitted by a host HOST. In detail, the memory controller 200 may control a program (or write) operation, a read operation, and an erase operation performed on the memory device 100 by providing the memory device 100 with an address ADDR, a command CMD, and a control signal CTRL. The memory controller 200 may transmit data DATA for the program operation to the memory device 100. The memory controller 200 may provide the memory device 100 with the data DATA having a size corresponding to a program unit of the memory device 100, the address ADDR in which the data DATA is stored, and the command CMD indicating a write request. For example, in the memory device 100, when one program unit corresponds to a size of three pages, the memory controller 200 may transmit, to the memory device 100, the data DATA having a size of 3 pages together with an address ADDR in which the data DATA is stored.

Although not shown, the memory controller 200 may include RAM, a processing unit, a host interface, and a memory interface. The RAM may be used as an operation memory of the processing unit, and the processing unit may control operations of the memory controller 200. The host interface may include protocols for exchanging data between the host HOST and the memory controller 200. For example, the memory controller 200 may be configured to communicate with the outside, that is, the host HOST, via at least one of various interface protocols such as Universal Serial Bus (USB), Multimedia Card (MMC), peripheral Component Interconnect Express (PCI-E), Advanced Technology Attachment (ATA), Serial-ATA, Parallel-ATA, Small Computer System Interface (SCSI), Enhanced Small Device Interface (ESDI), and Integrated Drive Electronics (IDE).

Figure 2:
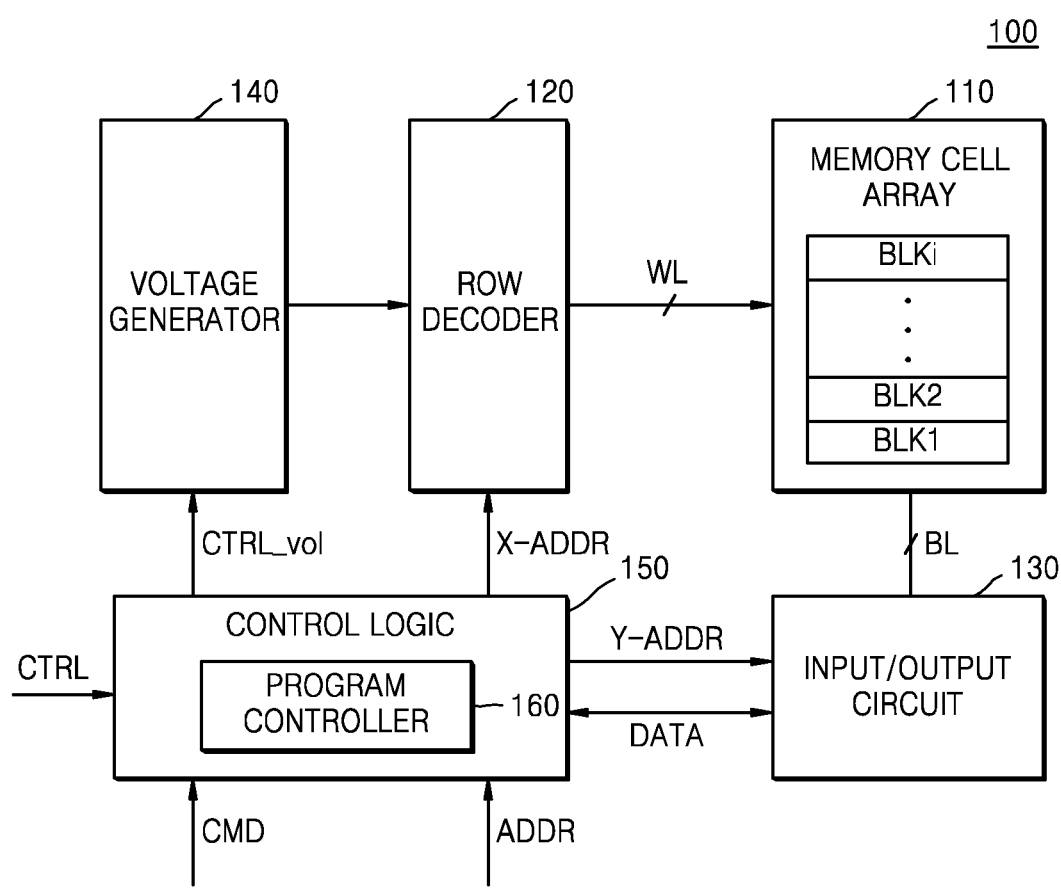
FIG. 2 is a block diagram of an example of a memory device included in the memory system of FIG. 1.

FIG. 2 is a block diagram of an example of the memory device 100 included in the memory system 10 of FIG. 1.

As shown in FIG. 2, the memory device 100 may include the memory cell array 110, a row decoder 120, an input/output circuit 130, a voltage generator 140, and a control logic 150.

The memory cell array 110 includes memory cells and may be connected to word lines WL, string selection lines SSL, ground selection lines GSL, and bit lines BL. In detail, the memory cell array 110 may be connected to the row decoder 120 via the word lines WL or the selection lines, that is, the string selection lines SSL and the ground selection lines GSL, and to the input/output circuit 130 via the bit lines BL.

The memory cell array 110 may include memory blocks BLK1 to BLKi. The memory blocks BLK1 to BLKi may include at least one of single-level cell blocks including single level cells, multi-level cell blocks including multi-level cell, and triple-level cell blocks including TLCs. Some of the memory blocks BLK1 to BLKi included in the memory cell array 110 may be single-level cell blocks, and others thereof may be multi-level cell blocks or triple-level cell blocks.

In an embodiment, each of the memory blocks BLK1 to BLKi may have a 3D structure (or a vertical structure). In particular, each of the memory blocks BLK1 to BLKi may include memory strings extending vertically with respect to a substrate. However, the memory blocks are not limited thereto, and each of the memory blocks BLK1 to BLKi may have a 2D structure.

When an erase voltage is applied to the memory cell array 110, the memory cells are in an erase state. When a program voltage is applied to the memory cell array 110, the memory cells are in a program state. In this case, each memory cell may be in an erase state E and at least one program state, which are classified according to a threshold voltage Vth.

In an embodiment, when a memory cell is a single level cell, the memory cell may be in an erase state and a program state. In another embodiment, when a memory cells is a multi-level cell, the memory cell may be in an erase state and at least three program states. States of memory cells will be described below.

The row decoder 120 may select some of the word lines WL in response to a row address X-ADDR. The row decoder 120 applies a word line voltage to the word lines WL. During a program operation, the row decoder 120 may apply a program voltage and a verification voltage to the selected word lines WL and a program inhibit voltage to unselected word lines WL. During a read operation, the row decoder 120 may apply a read voltage to selected word lines WL and a read inhibit voltage to unselected word lines WL. Also, the row decoder 120 may select some of the string selection lines SSL or some of the ground selection lines GSL, in response to the row address X-ADDR.

The input/output circuit 130 receives data from the outside (e.g., a memory controller 200) and stores the received data to the memory cell array 110. Also, the input/output circuit 130 may read data from the memory cell array 110 and output the read data to the outside or the control logic 160. The input/output circuit 130 may include page buffers (not shown) corresponding to the bit lines BL. The page buffers may be connected to the memory cell array 110 via the bit lines BL and may select some of the bit lines BL in response to a column address Y-ADDR received from the control logic 150. During the program operation, the page buffer may function as a write driver and may program data DATA that is intended to be stored in the memory cell array 110.

The voltage generator 140 may generate various voltages for performing program, read, and erase operations on the memory cell array 110, in response to a voltage control signal CTRL_vol. In detail, the voltage generator 140 may generate a word line voltage, for example, a program voltage (or a write voltage), a read voltage, a pass voltage (or a word line unselected voltage), or a verification voltage. The voltage generator 140 may generate a bit line voltage, for example, a bit line forcing voltage, or an inhibit voltage. Also, the voltage generator 140 may further generate a string selection line voltage and a ground selection line voltage based on the voltage control signal CTRL_vol.

The control logic 150 may write data to the memory cell array 110 or output various control signals for reading the data from the memory cell array 110, based on a command CMD, an address ADDR, and a control signal CTRL received from the memory controller 200 of FIG. 1. Thus, the control logic 150 may control various operations performed within the memory device 100 overall.

The control signals output from the control logic 150 may be provided to the voltage generator 140, the row decoder 120, and the input/output circuit 130. In detail, the control logic 150 may provide the voltage control signal CTRL_vol to the voltage generator 140, the row address X-ADDR to the row decoder 120, and the column address Y-ADDR to the input/output circuit 130. However, the control logic 150 is not limited thereto, and the control logic 150 may further provide other control signals to the voltage generator 140, the row decoder 120, and the input/output circuit 130.

In the present embodiment, the program controller 160 may generate a fail bit trend by executing program loops on the memory cells of the memory cell array 110 and using a result of executing each program loop. In an embodiment, the control logic 150 may receive, from the input/output circuit 130, data according to the result of a verification operation for each program loop, wherein the data is included in each program loop. The control logic 150 may include a fail bit counter and, for each program loop, may detect the number of memory cells having a threshold voltage lower than a verification level by counting the number of fail bits by using the data according to the verification operation.

The program controller 160 may perform an operation of predicting program loops to be executed on the memory cells, by using the fail bit trend. That is, the program controller 160 may execute the fail bit trend based on results of at least two of program loops that were already executed and may predict program loops to be executed later based on the fail bit trend. In an embodiment, the program controller 160 may identify program loops that are executed before a last program loop by predicting the last program loop that is to be executed last on the memory cells. The program controller 160 may change a level of a program voltage when the last program loop is executed based on a prediction result. In an embodiment, the program controller 160 may change the level of the program voltage when the last program loop is executed, based on a result of verifying any one of the program loops that are executed before the last program loop. The program controller 160 may control the voltage generator 140 to change the level of the program voltage when the last program loop is executed. The program controller 160 may control the voltage generator 140 in such a manner that a level of a step voltage is changed with respect to the program voltage when the last program loop is executed. Furthermore, the program controller 160 may set program voltages and verification voltages corresponding to the program loops and may change the level of the program voltage when the last program loop is executed. Also, the program controller 160 may change levels of program voltages corresponding to various program loops.

As described above, the program controller 160 may stably maintain general execution of program loops as much as possible by predicting program loops to be executed on the memory cells and changing only the level of the program voltage when a last program loop is executed. The program controller 160 may also secure reliability of a memory device 100 by changing only program voltages that may greatly affect the reliability.

Also, the control logic 150 may control overall operations performed on the memory device 100 and may perform operations, which are performed by the program controller 160, based on commands received from the memory controller 200 (of FIG. 1). The program controller 160 included in the control logic 150 may be embodied as a hardware component or firmware.

Figure 3:
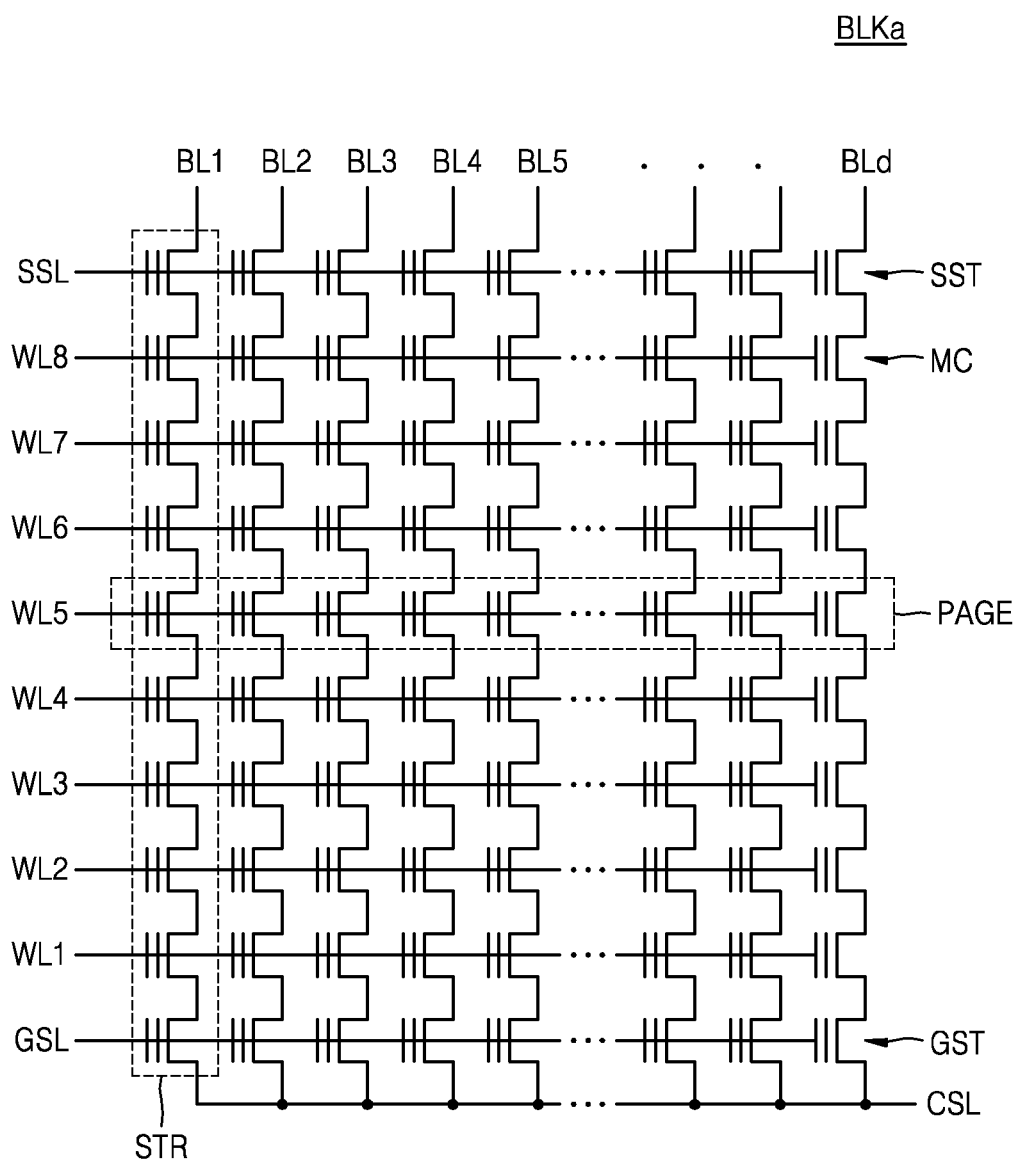
FIG. 3 is a circuit diagram of an example of a memory block according to an embodiment.

FIG. 3 is a circuit diagram of an example of a memory block according to an embodiment.

As shown in FIG. 3, a memory block BLKa may be a NAND flash memory having a horizontal structure. The memory block BLKa may include, for example, d strings STR connected to memory cells MC in series, where d is an integer equal to or greater than 2. The strings STR may each include a string selection transistor SST and a ground selection transistor GST respectively connected to both ends of the memory cells MC connected in series. The number of strings STR, the number of word lines WL, and the number of bit lines BL may vary according to embodiments.

A NAND flash memory device including the memory block BLKa having the structure shown in FIG. 3 may perform an erase operation in a memory block unit and a program operation in a unit of a page PAGE corresponding to each of the word lines WL1 to WL8. For example, when a memory cell MC is a single level cell, each of the word lines WL1 to WL8 may correspond to one page PAGE. As another example, when a memory cell MC is a multi-level cell or a TLC, each of the word lines WL1 to WL8 may correspond to multiple pages PAGE.

Figure 4:
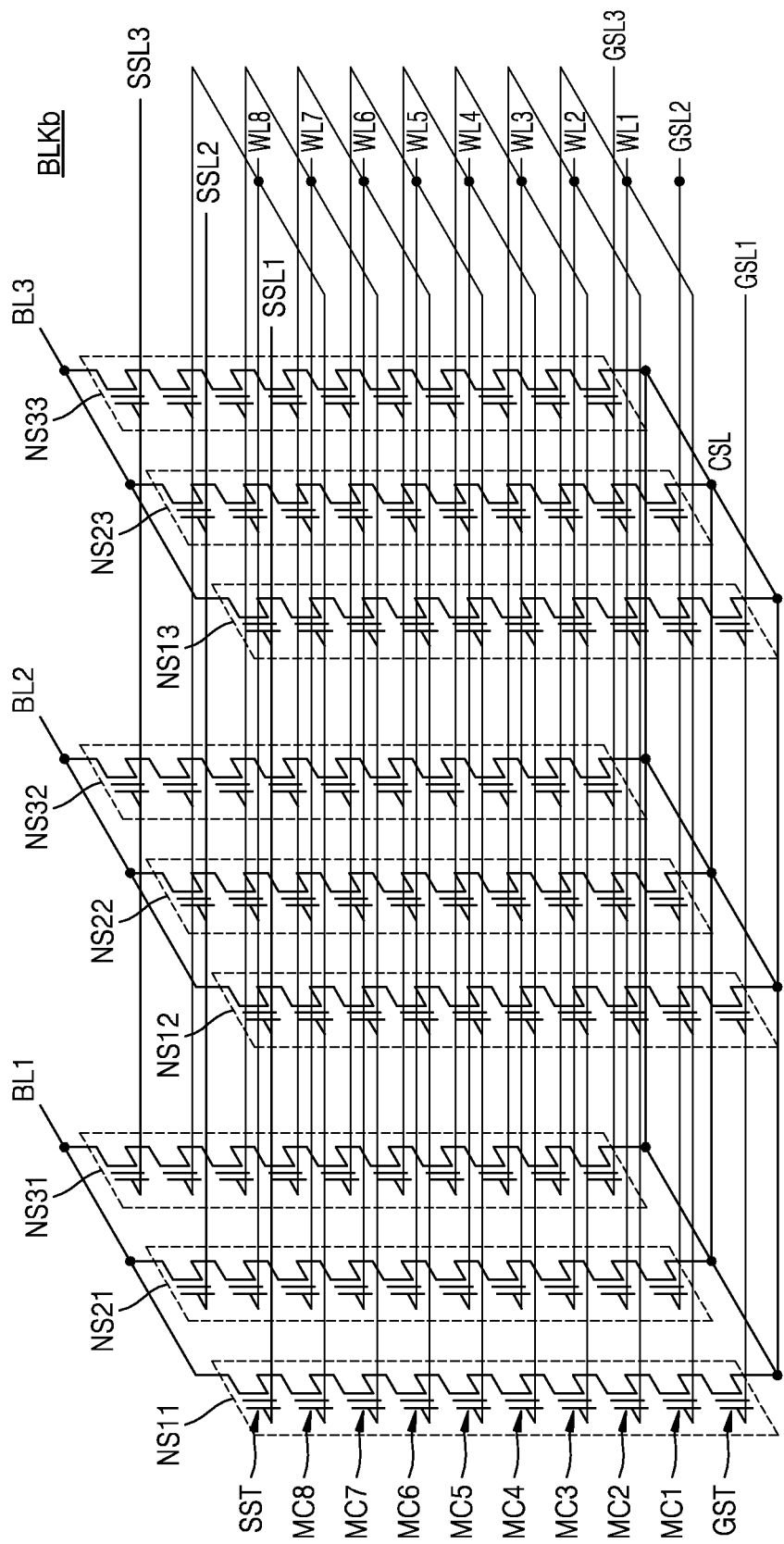
FIG. 4 is a circuit diagram of another example of a memory block according to an embodiment.

FIG. 4 is a circuit diagram of another example of a memory block according to an embodiment.

As shown in FIG. 4, a memory block BLKb may be a NAND flash memory having a vertical structure. The memory block BLKb may include NAND strings NS11 to NS33, word lines WL1 to WL8, bit lines BL1 to BL3, grounds selection lines GSL1 to GSL3, string selection lines SSL1 to SSL3, and a common source line CSL. The number of NAND strings, the number of word lines, the number of bit lines, the number of ground selection lines, and the number of string selection lines may vary according to embodiments.

The NAND strings NS11, NS21, and NS31 are provided between the first bit line BL1 and the common source line CSL. The NAND strings NS12, NS22, and NS32 are provided between the second bit line BL2 and the common source line CSL. The NAND strings NS13, NS23, and NS33 are provided between the third bit line BL3 and the common source line CSL. Each of the NAND strings NS11 to NS33 (e.g., the NAND string NS11) may include a string selection transistor SST, memory cells MC1 to MC8, and a ground selection transistor GST which are connected to each other in series. Hereinafter, a NAND string will be referred to as a string for convenience.

Strings that are commonly connected to one bit line form one column. For example, the strings NS11, NS21, and NS31 that are commonly connected to the first bit line BL1 may correspond to a first column. The strings NS12, NS22, and NS32 that are commonly connected to the second bit line BL2 may correspond to a second column. The strings NS13, NS23, and NS33 that are commonly connected to the third bit line BL3 may correspond to a third column.

Strings connected to one string selection line form one row. For example, the strings NS11, NS12, and NS13 connected to the first string selection line SSL1 may correspond to a first row. The strings NS21, NS22, and NS23 connected to the second string selection line SSL2 may correspond to a second row. The strings NS31, NS32, and NS33 connected to the third string selection line SSL3 may correspond to a third row.

The string selection transistor SST is connected to the first to third string selection lines SSL1 to SSL3. The memory cells are connected to their corresponding word lines WL1 to WL8. The ground selection transistor GST is connected to the ground selection lines GSL1 to GSL3. The string selection transistor SST is connected to its corresponding bit line BL, and the ground selection transistor GST is connected to the common source line CSL.

A word line (e.g., the first word line WL1) having a uniform height is commonly connected, and the first to third string selection lines SSL1 to SSL3 are separated from each other. For example, when memory cells connected to the first word line WL1 and included in the strings NS11, NS12, and NS13 are programmed, the first word line WL1 and the first string selection line SSL1 may be selected. In an embodiment, as shown in FIG. 4, the ground selection lines GSL1 to GSL3 may be separated from each other. In another embodiment, the ground selection lines GSL1 to GSL3 may be connected to each other.

Figure 5:
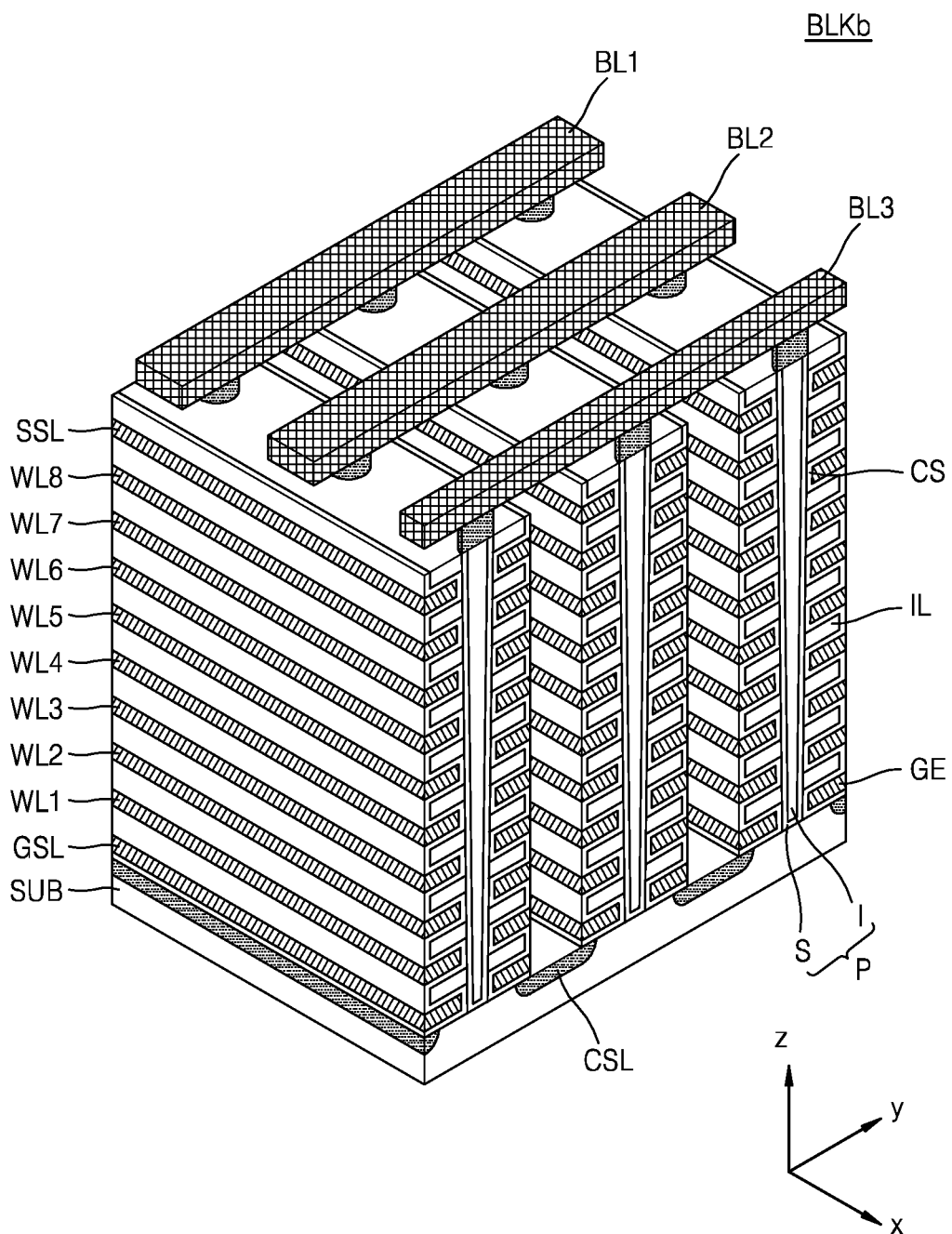
FIG. 5 is a perspective view of the memory block shown in the circuit diagram of FIG. 4.

FIG. 5 is a perspective view of the memory block BLKb shown in the circuit diagram of FIG. 4.

As shown in FIG. 5, the memory block BLKb is vertically formed from a substrate SUB. The substrate SUB may be a first conductive type (e.g., a p type) and may include common source lines CSL extending in a first direction (e.g., an x direction) on the substrate SUB and doped with second conductive-type impurities (e.g., an n type). The common source line CSL may function as a source region where a current is provided to memory cells of a vertical type.

On a region of the substrate SUB between two adjacent common source lines CSL, insulating layers IL extending in a second direction (e.g., a y direction) are sequentially provided in a third direction (e.g., a z direction) and are spaced apart from each other by a certain distance in the third direction. For example, the insulating layers IL may include insulating materials such as a silicon oxide.

In the region of the substrate SUB between two adjacent common source lines CSL, channel holes that are sequentially arranged in the first direction and penetrate the insulating layers IL in the third direction may be formed. The channel holes may be formed in a cup form (or a cylinder form of which a bottom is blocked) extending in a vertical direction. Alternatively, the channel holes may be in a pillar form as shown in FIG. 5. Hereinafter, the channel holes will be referred to as pillars. The pillars P may penetrate the insulating layers IL and thus may contact the substrate SUB. In detail, a surface layer S of each pillar P may include a silicon material of a first type and may function as a channel area. An internal layer I of each pillar P may include an air gap or an insulating material such as a silicon oxide.

On the region of the substrate SUB between two adjacent common source lines CSL, a charge storage layer CS is provided on exposed surfaces of the insulating layers IL, the pillars P, and the substrate SUB. For example, the charge storage layer CS may have an oxide-nitride-oxide (ONO) structure. Also, on the region of the substrate SUB between two adjacent common source lines CSL, gate electrodes GE may be provided on the exposed surface of the charge storage layer CS.

Drains or drain contacts (not shown) are provided on the pillars P. For example, the drains or the drain contacts DR may include silicon materials doped with impurities of the second conductive type. On the drains or the drain contacts DR, the bit lines BL extending in the second direction (e.g., the y direction) and spaced apart from one another by a certain distance in the first direction may be provided.

Figure 6:
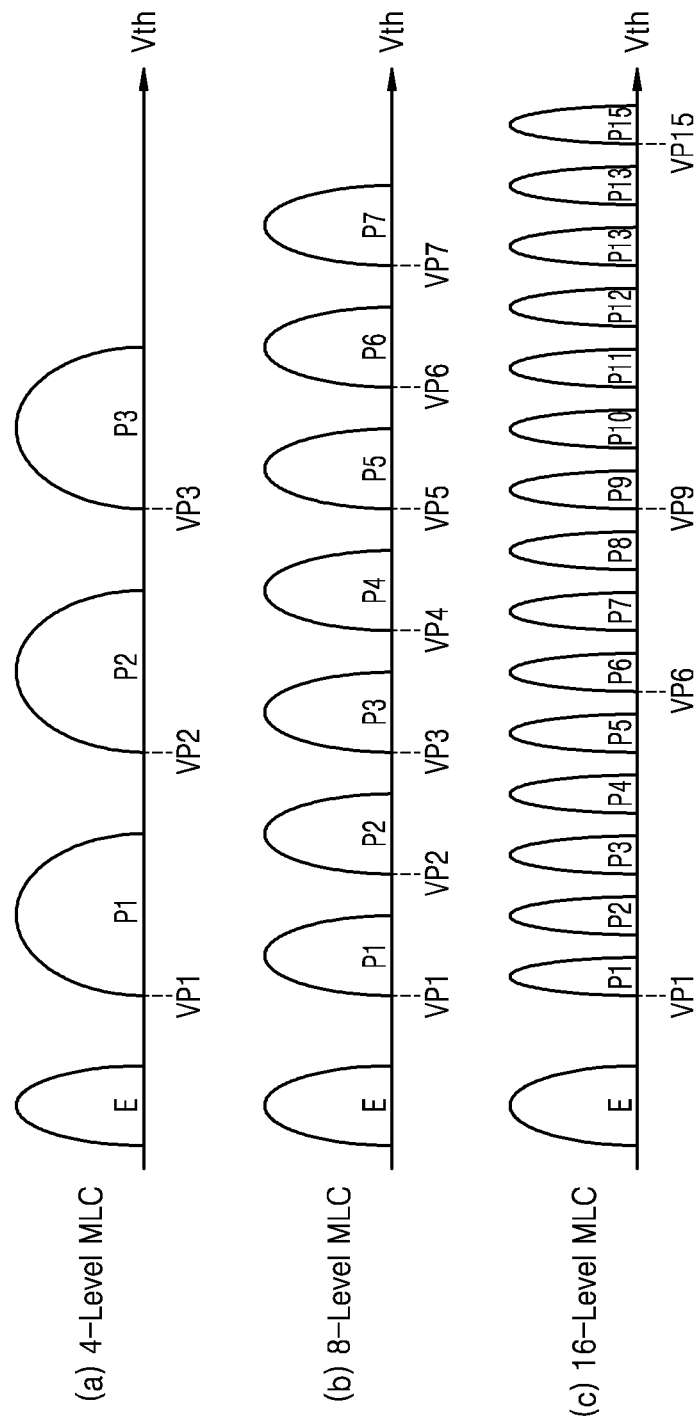
FIG. 6 illustrates schematic diagrams of threshold voltage distributions according to the number of data bits stored in memory cells.

FIG. 6 at a, b and c are schematic diagrams of threshold voltage distributions according to the number of data bits stored in memory cells.

As shown in FIG. 6a, when 2-bit data (or 4-level data/2-page data) is stored in one memory cell, memory cells of a memory device may each have a threshold voltage included in any one of four threshold voltage distributions E, P1, P2, and P3. The memory cells having the threshold voltage distribution E may be defined to be in an erase state. The memory cells having the threshold voltage distributions P1 to P3 may be defined to be in first to third program states. Voltages VP1 to VP3 indicate verification voltages used to determine whether the memory cells are respectively programmed to the threshold voltage distributions P1 to P3. Threshold voltages of memory cells in a selected word line may be distributed as shown in FIG. 6a after the 4-level data (or the 2-page data) is programmed to the memory cells in the selected word line.

As shown in FIG. 6b, when 3-bit data (or 8-level data/3-page data) is stored in one memory cell, memory cells may each have a threshold voltage included in any one of eight threshold voltage distributions E and P1 to P7. The threshold voltage distribution E includes threshold voltages of erased memory cells, and the other threshold voltage distributions P1 to P7 may include threshold voltages of programmed memory cells. Voltages VP1 to VP7 indicate verification voltages used to determine whether the memory cells are respectively programmed to the threshold voltage distributions P1 to P7. Threshold voltages of memory cells in a selected word line may be distributed as shown in FIG. 6b after the 8-level data (or the 3-page data) is programmed to the memory cells in the selected word line.

As shown in FIG. 6c, when 4-bit data (or 16-level data/4-page data) is stored in one memory cell, memory cells may each have a threshold voltage included in any one of 16 threshold voltage distributions E and P1 to P15. The threshold voltage distribution E may include threshold voltages of erased memory cells. The other threshold voltage distributions P1 to P15 may include threshold voltages of programmed memory cells. Voltages VP1 to VP15 indicate verification voltages used to determine whether the memory cells are respectively programmed to the threshold voltage distributions P1 to P15. Threshold voltages of memory cells in a selected word line may be distributed as shown in FIG.

6c after the 16-level data (or the 4-page data) is programmed to the memory cells in the selected word line.

As shown in FIG. 6 at a, b and c, the embodiments of the present disclosure may be applied to multi-level cells or single level cells. Also, a last program loop that is executed on the memory cells last may be a program loop that corresponds to a last threshold distribution in each drawing.

Figure 7:
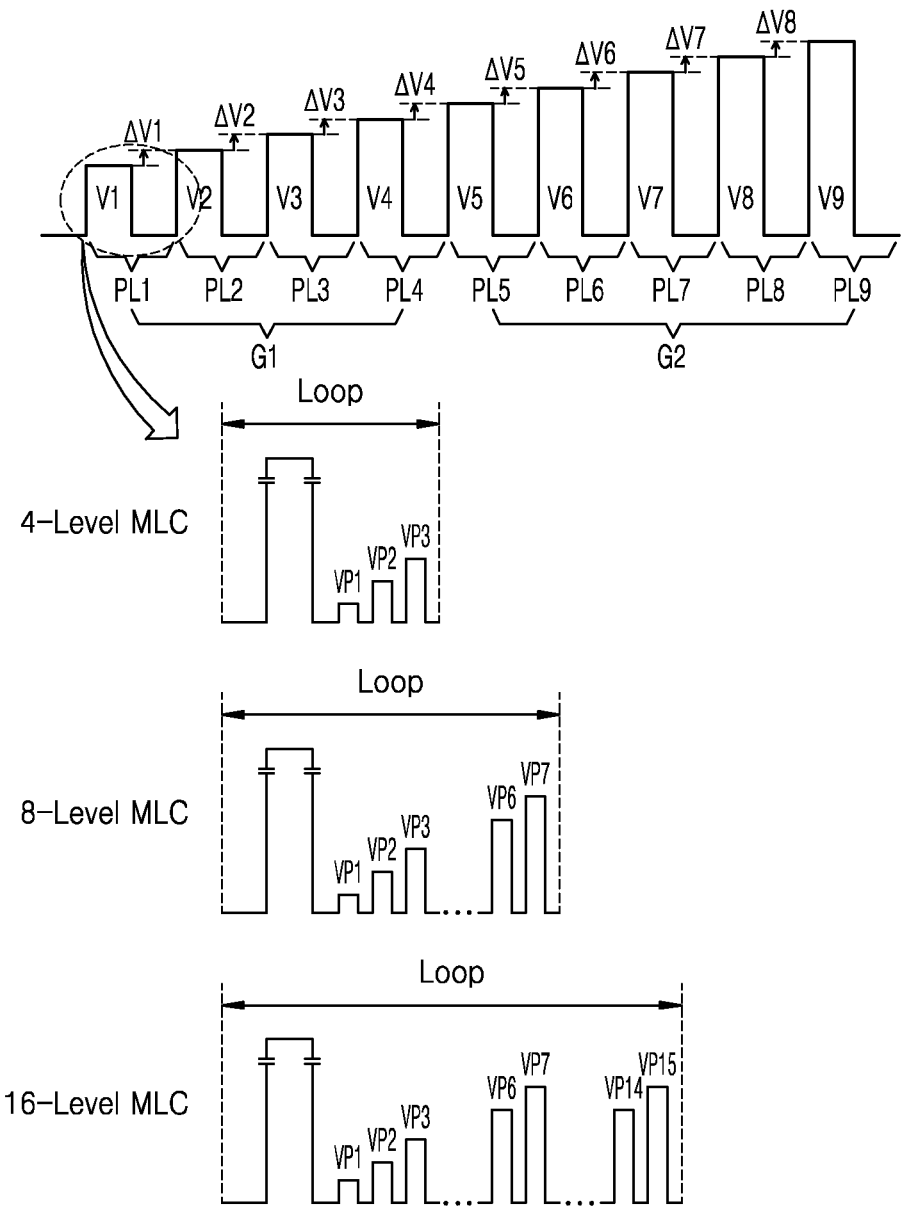
FIG. 7 is a diagram for explaining a program loop in detail.

FIG. 7 is a diagram for explaining a program loop in detail.

As shown in FIG. 7, in a programming method, a program voltage has certain program pulses V1 to V9 and is applied to a control gate of a storage device such as a memory cell. Sizes of the program pulses V1 to V9 increase together with respective continuous pulses by certain step sizes A V1 to A V8. Verification operations are performed in sections between the program pulses V1 to V9. That is, storage devices (memory cells in a selected word line) may be simultaneously programmed Programming levels (or threshold voltages) of such storage devices are read between the program pulses V1 to V9 that are continuous so as to determine whether the programming levels are greater than levels of verification voltages at which the storage devices are to be programmed.

In the case of a memory array including multi-level cells, verification operations may be performed with regard to each program state of the storage device in order to determine whether the storage device has reached a verification level related to data of the storage device. For example, multi-level cells that may store data in four program states may perform verification operations in relation to three comparison pointers (or verification voltages VP1 to VP3). Similarly, multi-level cells that may store data in eight program states may perform verification operations in relation to seven comparison pointers (or verification voltages VP1 to VP7). Multi-level cells that may store data in 16 program states perform verification operations in relation to 16 comparison pointers (or verification voltages VP1 to VP15).

The memory device may program data to the memory cells by executing program loops PL1 to PL7. As described above, the memory device according to an embodiment may execute first to fourth program loops PL1 to PL4 (G1) on the memory cells and may predict execution of fifth to ninth program loops PL5 to PL9 (G2) on the memory cells based on a result of executing the first to fourth program loops PL1 to PL4 (G1). That is, in order to complete the last program state P3, P7, or P15 described with reference to FIGS. 6a to 6c, the memory device may predict that it is necessary to execute the fifth to ninth program loops PL5 to PL9 (G2) based on a result of executing at least two of the first to fourth program loops PL1 to PL4 (G1). However, the memory device is not limited thereto.

The memory device may change a level of a program voltage V9 of the ninth program loop PL9 based on a result of verifying any one of the fifth to eighth program loops PL5 to PL8, which are predicted to be executed before the ninth program loop PL9 is executed. However, program loops are not limited to the aforementioned program loops, and the number of program loops may vary according to the number of bits in data stored in memory cells.

Figure 8A:
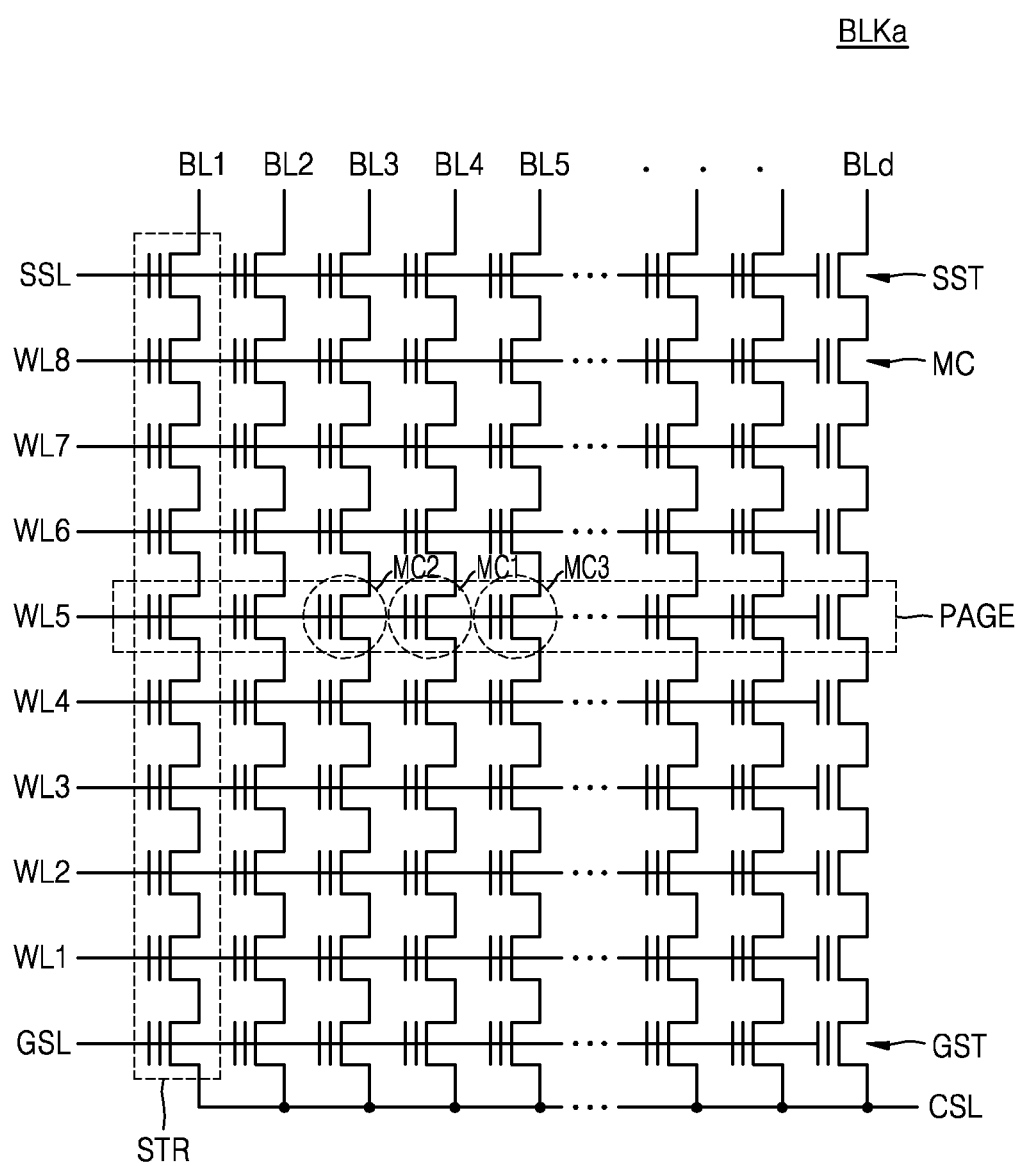
FIGS. 8A and 8B are diagrams for explaining a reason why a level of a program voltage of a last program loop has to be changed.
Figure 8B:
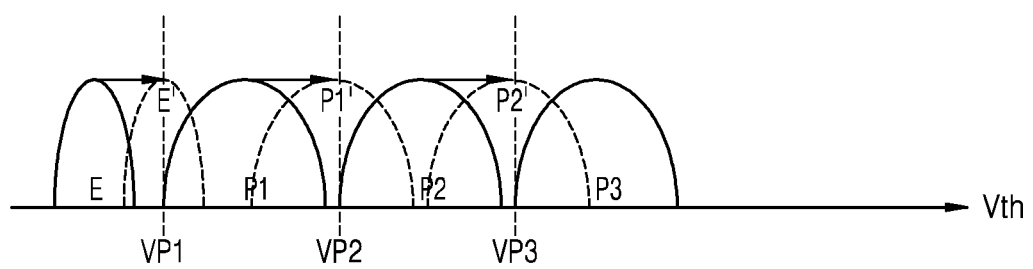

FIGS. 8a and 8b are diagrams for explaining a reason why a level of a program voltage of a last program loop has to be changed.

As shown in FIG. 8a, a word line WL5 selected to execute program loops may include first to third memory cells MC1 to MC3. Hereinafter, it is assumed that the first to third memory cells MC1 to MC3 may be multi-level cells in which 2-bit data is stored and may have threshold voltage distributions corresponding to the threshold voltage distributions E and P1 to P3 shown in FIG. 6a. The first memory cell MC1 may be in the erase state E, and the second memory cell MC2 may have the first threshold voltage distribution P1. The third memory cell MC3 may have the second threshold voltage distribution P2. In this case, as shown in FIG. 7, the first to ninth program loops PL1 to PL9 may be executed on the word line WL5 in such a manner that the first memory cell MC1 has the third threshold voltage distribution P3. That is, the ninth program loop PL9 may be executed on the first memory cell MC1, and a ninth program voltage V9 may be applied to the first memory cell MC1. However, the ninth program voltage V9 may disturb the second memory cell MC2, the third memory cell MC3, etc., which are adjacent to the first memory cell MC1.

As shown in FIG. 8b, some threshold voltage distributions E, P1, and P2 among the threshold voltage distributions E, P1 to P3 of the memory cells may move in a rightward direction due to the ninth program voltage V9 of the last program loop that is the ninth program loop PL9. That is, because of threshold voltage distributions E, P1', and P2' that are moved rightwards from their original locations, reliability of the memory device may degrade. Therefore, as a level of the ninth program voltage V9 of the last program loop that is the ninth program loop PL9 is low, the disturbance may decrease. However, when the ninth program voltage V9 is unnecessarily reduced, the number of program loops increases so that a program time may increase or a reliability problem caused by an applied low program voltage may occur. Thus, the memory device according to embodiments of the present disclosure may determine whether to decrease a level of the ninth program voltage V9 based on results of executing program loops that are executed before the ninth program loop PL9 is executed. As a result, the memory device may execute program loops that may improve reliability.

Figure 9:
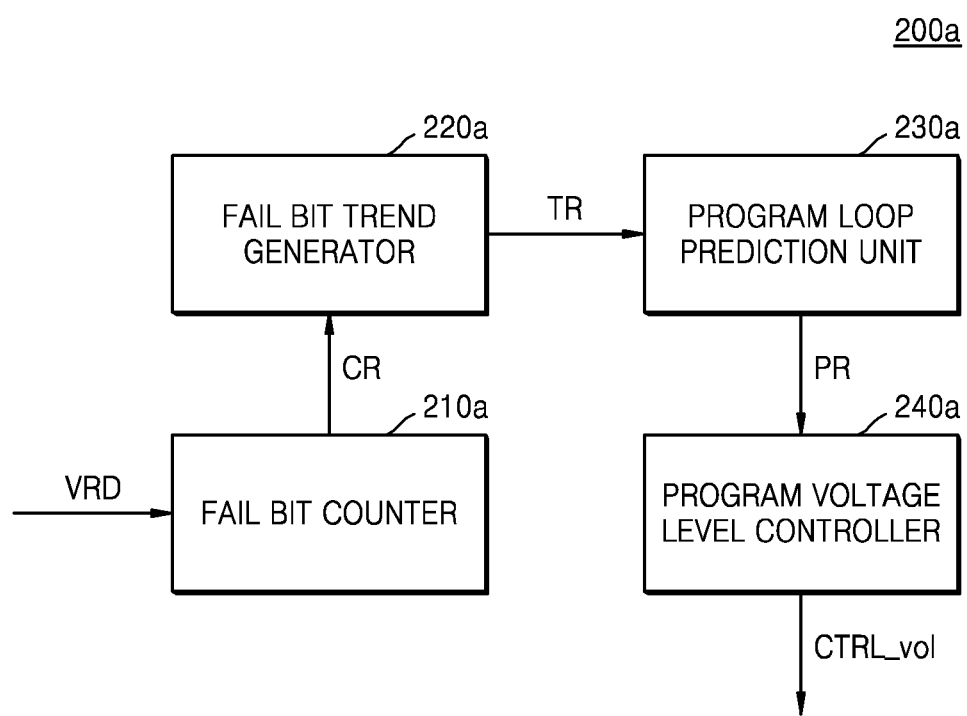
FIG. 9 is a detailed block diagram of a program controller included in a memory device according to an embodiment.

FIG. 9 is a detailed block diagram of a program controller 200a included in a memory device according to an embodiment. FIGS. 10a to 10c are diagrams of a method of generating a fail bit trend by a fail bit trend generator 220a, according to an embodiment.

As shown in FIG. 9, the program controller 200a may include a fail bit counter 210a, the fail bit trend generator 220a, a program loop prediction unit 230a, and a program voltage level controller 240a. The fail bit counter 210a may count the number of fail bits by receiving, from an input/output circuit, verification result data VRD that is obtained by performing an operation of verifying at least two program loops. The fail bit counter 210a may provide a count result CR to the fail bit trend generator 220a. The fail bit trend generator 220a may generate a fail bit trend indicating an amount of a change in the number of fail bits based on the count result CR, for each program loop. As described above, the program controller 200a and fail bit trend generator 22a are not limited thereto, and the fail bit trend generator 220a may generate a pass bit trend by using a pass bit counter.

FIGS. 10a to 10c show a process of forming the third threshold voltage distribution P3 shown in FIG. 6a. First of all, when an L program loop L Loop is executed on memory cells, memory cells A having a threshold voltage lower than or equal to/lower than the third verification voltage VP3 may be counted as fail bits by the fail bit counter 210a. Memory cells B having a threshold voltage equal to or higher than/higher than the third verification voltage VP3 may be counted as pass bits by the fail bit counter 210a.

When an L+1 program loop L+1 Loop is executed on memory cells, memory cells C having a threshold voltage lower than or equal to/lower than the third verification voltage VP3 may be counted as fail bits by the fail bit counter 210a. Also, when an L+2 program loop L+2 Loop is executed on memory cells, memory cells E having a threshold voltage lower than or equal to/lower than the third verification voltage VP3 may be counted as fail bits by the fail bit counter 210a. As in an exemplary embodiment, the fail bit counter 210a may provide the fail bit trend generator 220a with the count result CR including the number of fail bits that are counted as above.

As shown in FIG. 9 and FIGS. 10a to 10c, as L to L+2 program loops L Loop to L+2 Loop are executed by using the ISPP method, the number of fail bits may decrease in a certain variation. The fail bit trend generator 220a may generate the certain variation as a fail bit trend. For example, the fail bit trend generator 220a may calculate a difference between the number of fail bits which are generated as a result of executing the L program loop L Loop, and the number of fail bits which are generated as a result of executing the L+1 program loop L+1 Loop. The fail bit trend generator 220a may generate the fail bit trend based on the calculated difference. Furthermore, the fail bit trend generator 220a may calculate an average of the difference between the number of fail bits which are generated as a result of executing the L program loop L Loop, and the number of fail bits which are generated as a result of executing the L+1 program loop L+1 Loop The fail bit trend generator 220a may also calculate a difference between the number of fail bits which are generated as a result of executing the L+1 program loop L+1 Loop, and the number of fail bits which are generated as a result of executing the L+2 program loop L+2 Loop. The fail bit trend generator 220a may generate the fail bit trend based on the calculated average. However, the fail bit trend generator 220a is not limited thereto.

The fail bit trend generator 220a may provide a fail bit trend TR to the program loop prediction unit 230a. The program loop prediction unit 230a may predict program loops to be executed on memory cells based on the fail bit trend TR. For example, the program loop prediction unit 230a may predict program loops including a last program loop based on variations in the number of fail bits of each program loop, which are shown in the fail bit trend TR. Detailed descriptions thereof will be provided later.

The program loop prediction unit 230a may provide the program voltage level controller 240a with a prediction result PR including information about the prediction of the program loops to be executed on the memory cells. The program voltage level controller 240a may control a change in a level of a program voltage of the last program loop based on the prediction result PR. In an embodiment, the program voltage level controller 240a may provide the voltage control signal CTRL_vol to the voltage generator 140 (of FIG. 2) so as to change the level of the program voltage of the last program loop. A degree of the change in the level of the program voltage of the last program loop will be described later.

Figure 11:
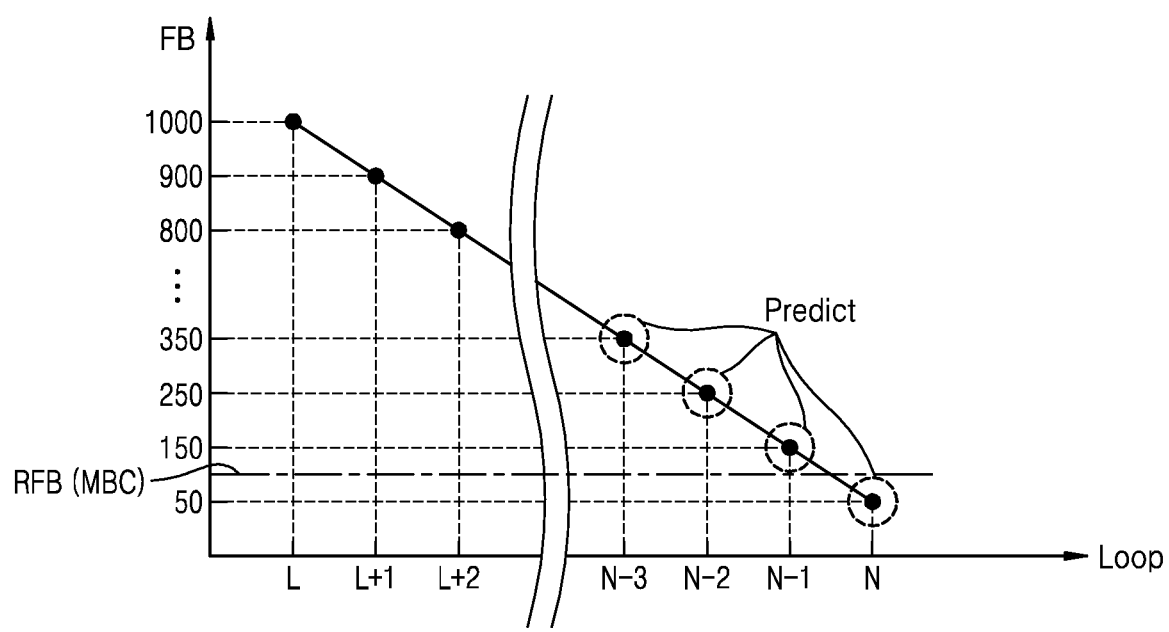
FIGS. 11 and 12 are diagrams of methods of predicting a program loop and changing a program voltage level of the last program loop, according to an embodiment.
Figure 12:
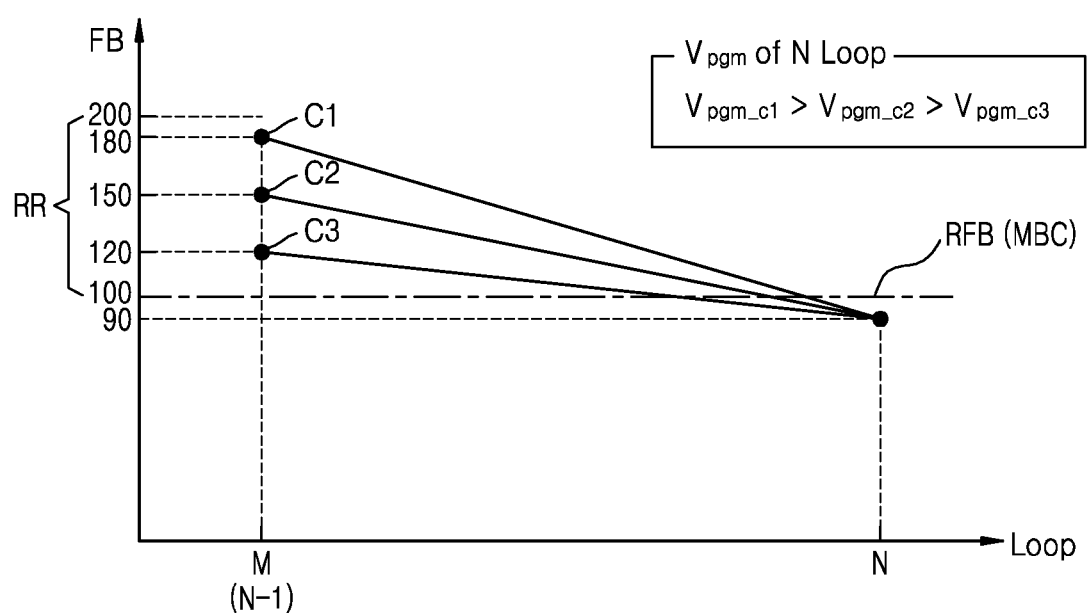

FIGS. 11 and 12 are diagrams of methods of predicting a program loop and changing a program voltage level of the last program loop, according to an embodiment.

As shown in FIGS. 9 and 11, the fail bit counter 210a may generate a count result CR by counting the number of fail bits based on verification result data VRD that is obtained by executing at least two of program loops L, L+1, and L+3. The fail bit trend generator 220a may generate a variation in the number of fail bits of each program loop as a fail bit trend TR, based on the count result CR. As shown in FIG. 11, the fail bit trend generator 220a may generate a value of "100" as the fail bit trend TR. The value of "100" may be referred to as a gradient of the number of fail bits.

The program loop prediction unit 230a may predict program loops N−3 to N to be executed later, based on the fail bit trend TR. In an embodiment, the program loop prediction unit 230a may predict, as a last program loop, a program loop corresponding to the number of fail bits FB which is predicted to be lower than the number of reference fail bits RFB, based on the fail bit trend TR. The number of reference fail bits RFB may correspond to a value of mass bit count that may be restored by an error correction code (ECC) logic included in the memory device. Therefore, the program loop prediction unit 230a may predict an N program loop N as the last program loop. The program voltage level controller 240a may control a change in a level of a program voltage of the N program loop N based on a prediction result PR that is obtained by predicting the N program loop N as the last program loop.

Referring to FIGS. 9 and 12, the program voltage level controller 240a may determine whether to change the level of the program voltage of the N program loop N based on the number of fail bits that are counted by the fail bit counter 210a as a result of executing a change reference program loop M. In an embodiment, the change reference program loop M may correspond to any one of the predicted program loops. Moreover, the program voltage level controller 240a may select any one of the predicted program loops as the change reference program loop M. That is, the program voltage level controller 240a may determine whether to change the level of the program voltage of the N program loop N based on whether the number of fail bits that are counted as a result of executing an M program loop is included in a reference range RR corresponding to the M program loop. The program voltage level controller 240a may generate the reference range RR by using the number of reference fail bits RFB and the fail bit trend TR. However, the control logic 160 and the program voltage level controller 240a are not limited thereto. The reference range RR may be generated by another block included in the control logic 160 or may be set from the outside.

In an embodiment, the program voltage level controller 240a may generate the reference range RR through the following calculation.

The reference range RR may be generated by calculating the sum of the number of reference bits RFB and the fail bit trend, multiplied by the difference between the last program loop N and the change reference program loop M−1. Alternatively, the reference range RR may be generated by calculating the sum of the number of reference bits RFB and the fail bit trend, multiplied by the different between the last program loop N and the change reference program loop M.

As shown in FIG. 12, the change reference program loop is the N−1 program loop N−1 that is executed right before (immediately sequentially prior to) the last program loop N, and thus the generated reference range RR may be "100 or 200". The program voltage level controller 240a may determine to change the level of the program voltage of the N program loop N when the number of fail bits that are generated as a result of executing the N−1 program loop N−1 is included in the reference range RR. The program voltage level controller 240a may variably change the level of the program voltage of the N program loop N based on the number of fail bits that are generated as the result of executing the N−1 program loop N−1. In an embodiment, as the number of fail bits that are generated as the result of executing the N−1 program loop N−1 is low, the level of the program voltage of the N program loop N may be changed to be lower than a level that is previously set. Furthermore, when the number of fail bits that are generated as the result of executing the N−1 program loop N−1 equals a certain value, the level of the program voltage of the N program loop N may not be changed.

For example, as in a first case C1, when the number of fail bits that are generated as the result of executing the N−1 program loop N−1 is "180", the N program loop N is executed at a first case program voltage Vpgm_c1. As in a second case C2, when the number of fail bits that are generated as the result of executing the N−1 program loop N−1 is "150", the N program loop N is executed at a second case program voltage Vpgm_c2. As in a third case C3, when the number of fail bits that are generated as the result of executing the N−1 program loop N−1 is "120", the N program loop N is executed at a third case program voltage Vpgm_c3. Levels of the first case program voltage Vpgm_c1, the second case program voltage Vpgm_c2, and the third case program voltage Vpgm_c3 may decrease in the stated order.

In another embodiment, a voltage level change value may correspond to the number of fail bits generated as the result of executing the change reference program loop M. A voltage level change table may be set based on the reference range RR. By referring to the voltage level change table, the program voltage level controller 240a may control the change in the level of the program voltage of the N program loop N based on the voltage level change value corresponding to the number of fail bits generated as the result of executing the change reference program loop M. Detailed descriptions thereof will be provided below.

Figure 13A:
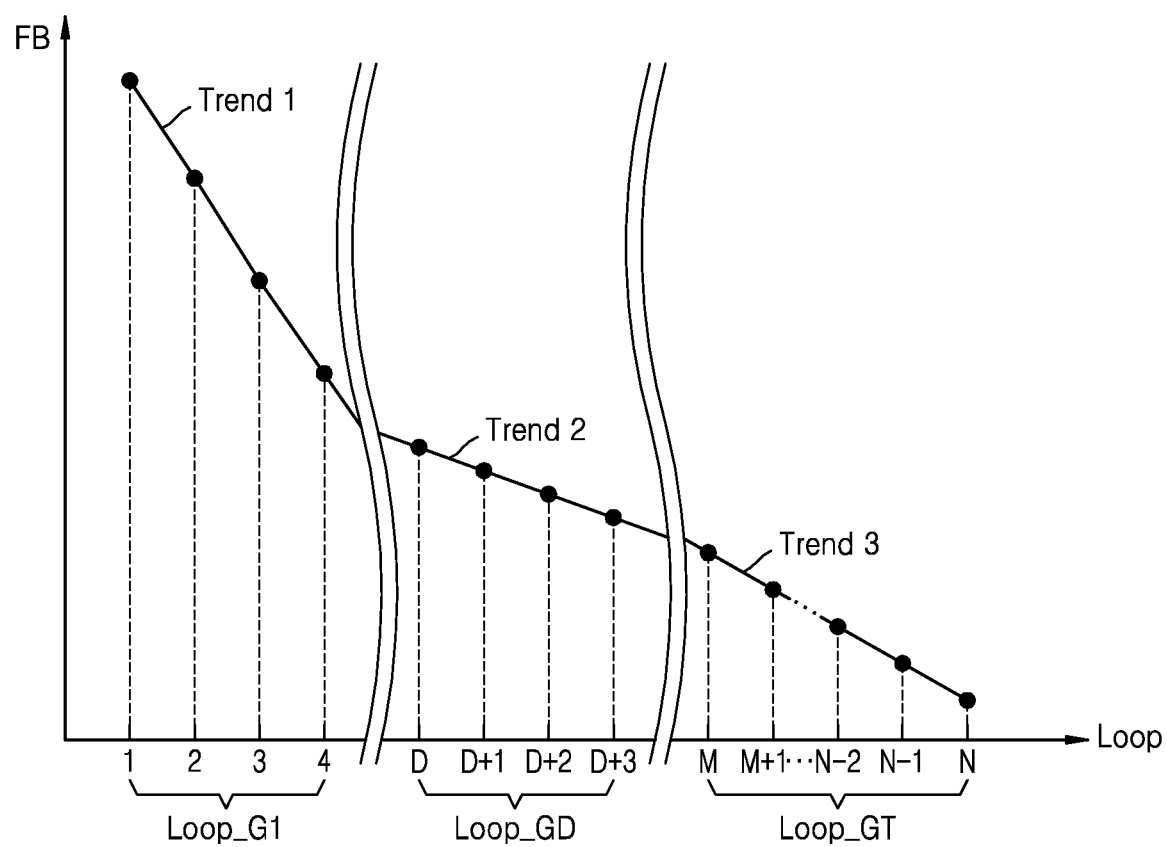
FIG. 13A is a graph for explaining a reason why a timing for generating a fail bit trend has to be set.

FIG. 13a is a graph for explaining a reason why a timing for generating a fail bit trend has to be set. FIGS. 13b to 13e are diagrams of a fail bit trend generation timing of a fail bit trend generator, according to an embodiment.

As shown in FIG. 13a, a fail bit trend Trend 1 may correspond to a first program loop group Loop_G1 including first to fourth program loops 1 to 4. A fail bit trend Trend 2 may correspond to a D program loop group Loop_GD including D to D+3 program loops D to D+3. A fail bit trend Trend 3 may correspond to a program loop target group Loop_GT including M to N program loops M to N. The fail bit trend Trend 1, fail bit Trend 2 and fail bit Trend 3 may have different values. Therefore, in order to appropriately predict the N program loop N that is the last program loop, the fail bit trend Trend 3, which is generated using at least two of the M to N program loops included in the program loop target group Loop_GT, is required.

Figure 13B:
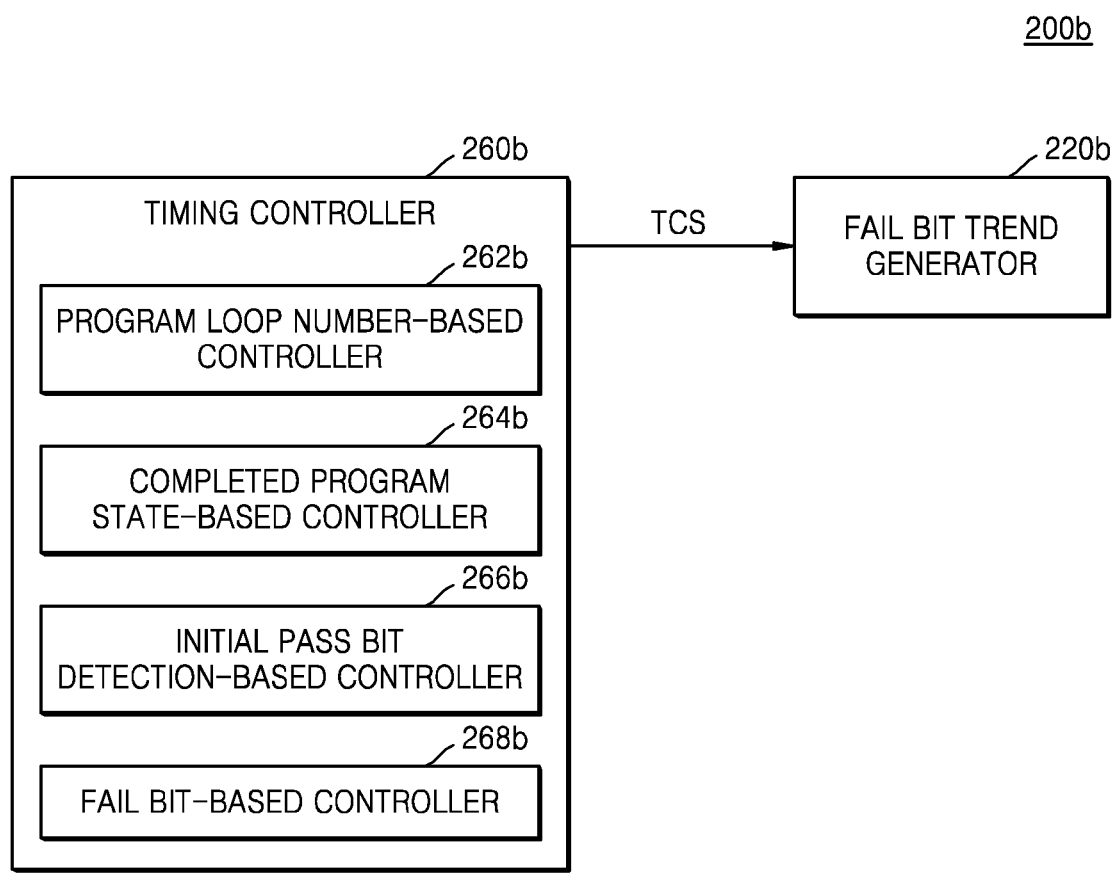
FIGS. 13B to 13E are diagrams of a fail bit trend generation timing of a fail bit trend generator, according to an embodiment.

As shown in FIG. 13b, a program controller 200b may include a fail bit trend generator 220b and a timing controller 260b. In an embodiment, the timing controller 260b may control a fail bit trend generation timing of the fail bit trend generator 220b in such a manner that the fail bit trend generator 220b generates a fail bit trend, that is, the fail bit trend Trend 3, necessary to predict program loops including the N program loop N of FIG. 13a. In an embodiment, the timing controller 260b may determine a fail bit trend generation timing based on at least one of an execution state in which program loops are executed on memory cells and the number of program loops executed on the memory cells.

The timing controller 206b may include a program loop number-based controller 262b, a completed program state-based controller 264b, an initial pass bit detection-based controller 266b, and a fail bit-based controller 268b. The timing controller 260b may determine the fail bit trend generation timing by using the completed program state-based controller 264b, the initial pass bit detection-based controller 266b, and the fail bit-based controller 268b based on the execution state in which the program loops are executed on the memory cells. The timing controller 260b may determine a fail bit trend generation timing based on the number of program loops executed on the memory cells, by using the program loop number-based controller 262b. For convenience, the timing controller 260b includes the program loops number-based controller 262b, the completed program state-based controller 264b, the initial pass bit detection-based controller 266b, and the fail bit-based controller 268b, but the timing controller 260b may include at least one of the program loops number-based controller 262b, the completed program state-based controller 264b, the initial pass bit detection-based controller 266b, and the fail bit-based controller 268b.

The program loops number-based controller 262b may generate the fail bit trend generation timing of the fail bit trend generator 220b, based on the pre-set number of program loops. For example, a pre-set program loop circuit may be set to have a value "M−1" in the program loops number-based controller 262b. The program loops number-based controller 262b may control in such a manner that the fail bit trend generator 220b generates a fail bit trend after an M−1 program loop is executed based on the set value. The fail bit trend generator 220b may generate a fail bit trend based on results of executing at least two of the program loops including the M program loop that is executed.

Figure 13C:
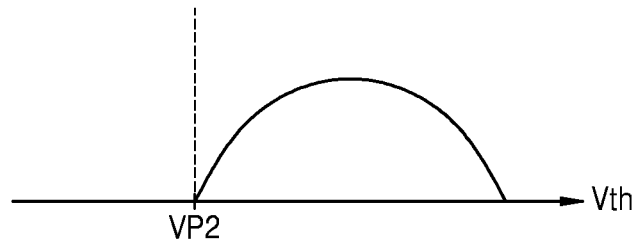

The completed program state-based controller 264b may control a fail bit trend generation timing of the fail bit trend generator 220b based on a state of a program that is completed after executing programs on memory cells. Referring to FIG. 6a, threshold voltage distributions of the memory cells may correspond to an erase state E, a first program state P1, a second program state P2, and a third program state P3, respectively. For example, the completed program state-based controller 264b may control the fail bit trend generator 220b to generate the fail bit trend after the "second program state P2" is completed. As shown in FIG. 13c, the completed program state-based controller 264b may control the fail bit trend generator 220b to generate the fail bit trend after the threshold voltage distributions of the memory cells are greater than the second verification voltage VP2 as the result of executing the M−1 program loop. Accordingly, the fail bit trend generator 220b may generate a fail bit trend based on a result of executing at least two of the program loops including the M program loop that is executed.

Figure 13D:
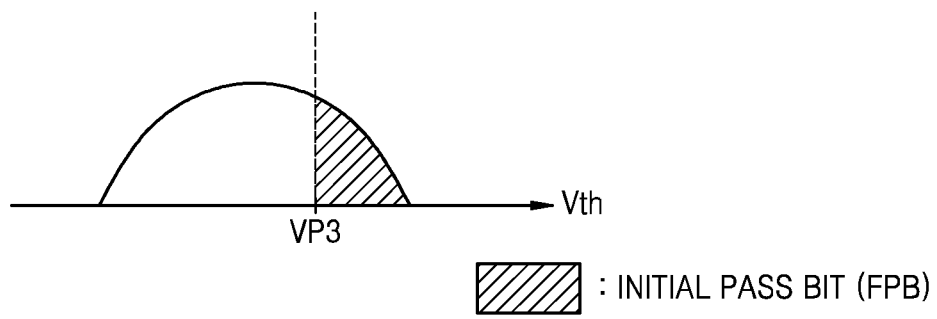

In order to generate a last program state, the initial pass bit detection-based controller 266b may control a fail bit trend generation timing of the fail bit trend generator 220b based on a program loop, from which an initial pass bit is detected, when the program loops are executed on the memory cells. Referring to FIG. 6a, the third program state P3 may correspond to the last program state. For example, the initial pass bit detection-based controller 266b may control in such a manner that the fail bit trend generator 220b generates a fail bit trend when the initial pass bit is detected when the program loops are executed on the memory cells to generate the "third program state" corresponding to the last program state. As shown in FIG. 13d, the initial pass bit detection-based controller 266b may control the fail bit trend generator 220b to generate the fail bit trend after the first pass bit is detected as a result of executing an M−1 loop to generate the third program state.

As a result, the fail bit trend generator 220b may generate the fail bit trend based on the result of executing at least two of the program loops including the M program loop that is executed.

Figure 13E:
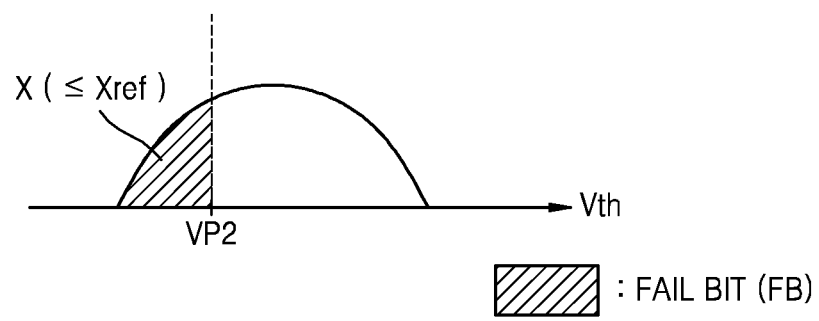

The fail bit-based controller 268b may control the fail bit generation timing of the fail bit trend generator 268b based on whether the number of the generated fail bits is less than the number of reference timing fail bits as the result of executing the program loops to generate a program state prior to the last program state. In an embodiment, the fail bit-based controller 268b may control the fail bit trend generation timing of the fail bit trend generator 220b based on whether the number of fail bits is lower than the number of reference timing fail bits. The fail bits are those generated as a result of executing program loops for generating a program state right before (immediately sequentially prior to) the last program state on the memory cells. Referring to FIG. 6a, the program state right before (immediately sequentially prior to) the last program state may correspond to the second program state P2. For example, the fail bit-based controller 268b may control the fail bit trend generator 220b to generate the fail bit trend when the number of the generated fail bits is less than the number of reference timing fail bits as the result of executing the program loops on the memory cells to generate the "second program state P2". As shown in FIG. 13e, the fail bit-based controller 268b may control the fail bit trend generator 220b to generate the fail bit trend when the number X of the generated fail bits is less than the number Xref of the reference timing fail bit as the result of executing the M−1 loop to generate the second program state P2. Accordingly, the fail bit trend generator 220b may generate the fail bit trend based on the result of executing at least two of the program loops including the M program loop that is executed.

In another embodiment, the timing controller 260b may provide the fail bit trend generator 220b with a timing control signal TCS in order to control the fail bit trend generation timing as described above. In an embodiment, the timing control signal TCS may correspond to an activation/inactivation control signal of the fail bit trend generator 220b.

As described above, by controlling the fail bit trend generation timing of the fail bit trend generator 220b, program loops including last program loops to be executed may be predicted exactly.

Figure 14:
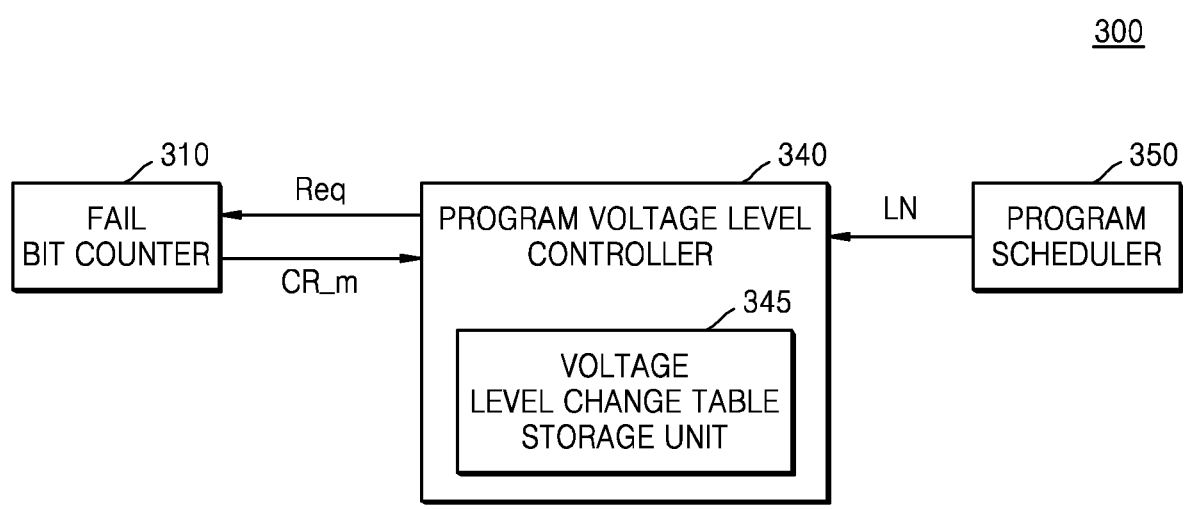
FIG. 14 is a block diagram of a method of controlling a program voltage level, according to an embodiment.

FIG. 14 is a block diagram of a method of controlling a program voltage level, according to an embodiment.

As shown in FIG. 14, the program controller 300 may include a fail bit counter 310, a program voltage level controller 340, and a program scheduler 350. According to an embodiment, as described above, the program voltage level controller 340 may control the change in the level of the program voltage by using the number of fail bits corresponding to the change reference program loops. The program scheduler 350 may provide the program voltage level controller 340 with information LN about program loops that are currently being executed or finish being executed. In an embodiment, the program voltage level controller 340 may identify whether the change reference program loop is executed by referring to the information LN. When the change reference program loop is executed, the program voltage level controller 340 may send, to the fail bit counter 310, a request Req for the number of fail bits corresponding to the change reference program loop. The fail bit counter 31 may respond to the request Req and may provide the program voltage level controller 340 with a count result CR_m including the number of fail bits corresponding to the change reference program loop. However, the program controller 300 is not limited thereto, and the above operation may be performed in various manners.

The program voltage level controller 340 may include a voltage level change table storage unit 345. The voltage level change table storage unit 345 may store tables showing voltage level changes which are set based on a reference range corresponding to the change reference program loop.

Figure 15C:
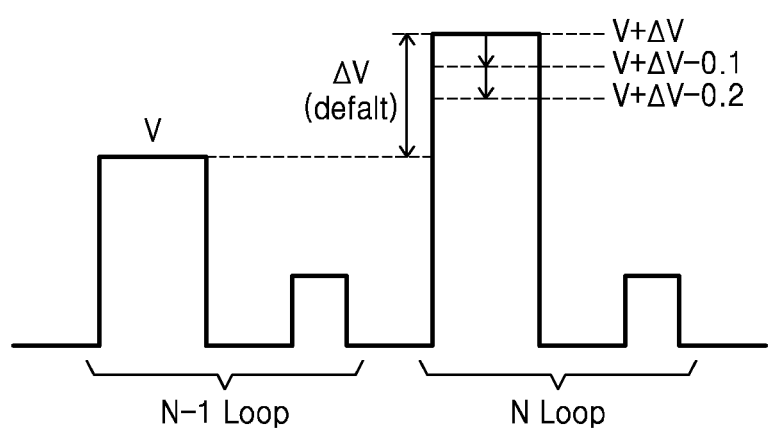
FIG. 15C is a diagram of an operation of changing a program voltage level of a last program loop, according to an embodiment.

FIGS. 15a and 15b are tables showing voltage level changes according to an embodiment. FIG. 15c is a diagram of an operation of changing a program voltage level of a last program loop, according to an embodiment.

As shown in FIG. 15a, a voltage level change table PVLT_Table may include first to k ranges R1 to Rk corresponding to a fail bit range indicating a certain range of the number of fail bits and first to k voltage change levels L1 to Lk respectively corresponding to the first to k ranges R1 to Rk. In an embodiment, the program voltage level controller 340 of FIG. 14 may refer to the voltage level change table PVLT_Table and control the change in the level of the program voltage of the last program loop based on a voltage change level corresponding to a range including the number of fail bits which are generated as a result of executing change reference program loop.

As shown in FIG. 15b, the fail bit range indicating the certain range of the number of fail bits in the voltage level change table PVLT_Table may be set based on a reference range corresponding to the change reference program loop. That is, the fail bit range may be set based on a ratio of the reference range. For example, the voltage level change table PVLT_Table may show the first range R1, the second range R2, and the third range R3. The first range R1 may include the number of fail bits that is at least 60% of the reference range. The second range R2 may include the number of fail bits that is equal to or greater than 40% but less than 60% of the reference range. The third range R3 may be less than 40% of the reference range.

Referring to FIGS. 15b and 15c, when the number of fail bits generated based on the change reference program loop belongs to the first range R1, the voltage change level becomes 0 V, and the change in the level of the program voltage may be controlled. A last program operation may be performed at a program voltage (V+ΔV) that is increased by a step voltage (ΔV) that is set at a level of a program voltage V of a program loop (i.e., the N−1 program loop N−1 Loop) executed right before (immediately sequentially prior to) the last program loop (i.e., the N program loop N).

When the number of fail bits generated due to the change reference program loop belongs to the second range R2, the voltage change level becomes −0.1 V, and the change in the level of the program voltage may be controlled. A last program operation may be performed at a program voltage (V+ΔV−0.1) that is decreased by 0.1 V from the voltage that is increased by the step voltage (ΔV) that is set at the level of the program voltage V of the program loop (i.e., the N−1 program loop N−1 Loop) executed right before (immediately sequentially prior to) the last program loop (i.e., the N program loop N).

When the number of fail bits generated due to the change reference program loop belongs to the third range R3, the voltage change level becomes −0.2 V, and the change in the level of the program voltage may be controlled. A last program operation may be performed at a program voltage (V+ΔV−0.2) that is decreased by 0.2 V from the voltage that is increased by the step voltage (ΔV) that is set at the level of the program voltage V of the program loop (i.e., the N−1 program loop N−1 Loop) executed right before (immediately sequentially prior to) the last program loop (i.e., the N program loop N).

However, the voltage change levels are not limited thereto. The voltage level change table PVLT_Table may be set in various manners, and ranges and values of voltage change levels which corresponds to respective ranges may vary.

Figure 16:
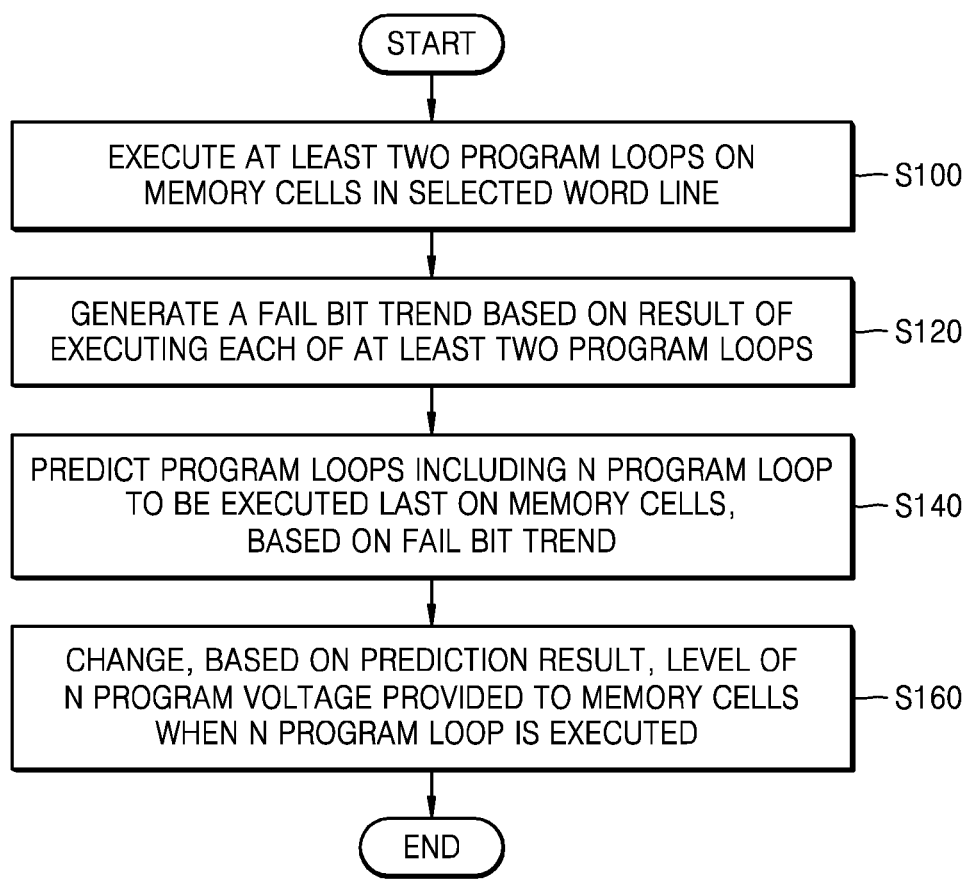
FIG. 16 is a flowchart of a method of changing a program voltage level of a last program loop, according to an embodiment.

FIG. 16 is a flowchart of a method of changing a program voltage level of a last program loop, according to an embodiment.

As shown in FIG. 16, in operation S100, at least two program loops are executed on memory cells in a selected word line. In operation S120, a fail bit trend is generated based on a result of executing each of the at least two program loops. In operation S140, by using the fail bit trend, program loops including the N program loop that is a last program loop to be executed on the memory cells are predicted. In operation S160, based on a prediction result, a level of an N program voltage, which is provided to the memory cells while the N program loop is executed, is changed.

Figure 17:
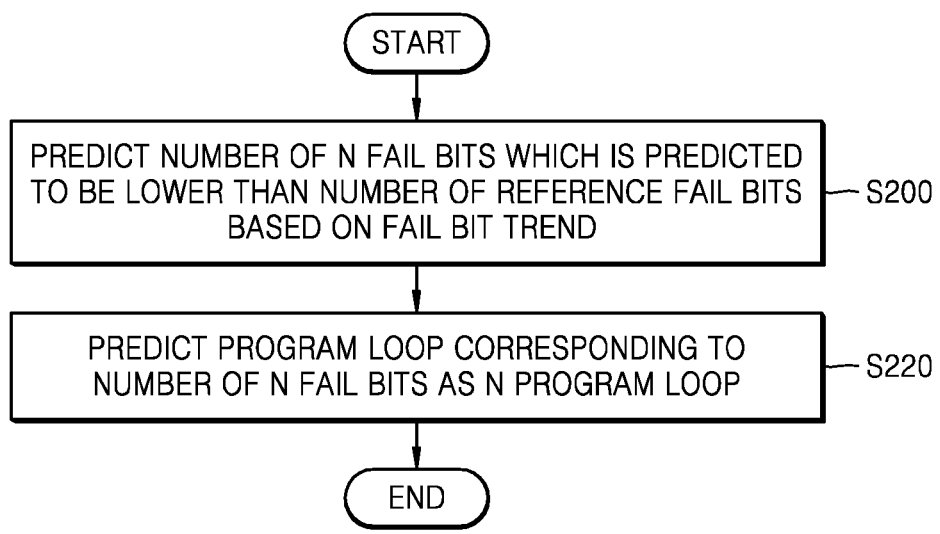
FIG. 17 is a flowchart of a method of predicting program loops to be executed, according to another embodiment.

FIG. 17 is a flowchart of a method of predicting program loops to be executed, according to another embodiment.

As shown in FIG. 17, by using the fail bit trend, the N number of fail bits that is predicted to be lower than the standard number of fail bits is detected in operation S200. In operation S220, a program loop corresponding to the N number of fail bits is predicted as an N program loop that is the last program loop to be executed on the memory cells.

Figure 18:
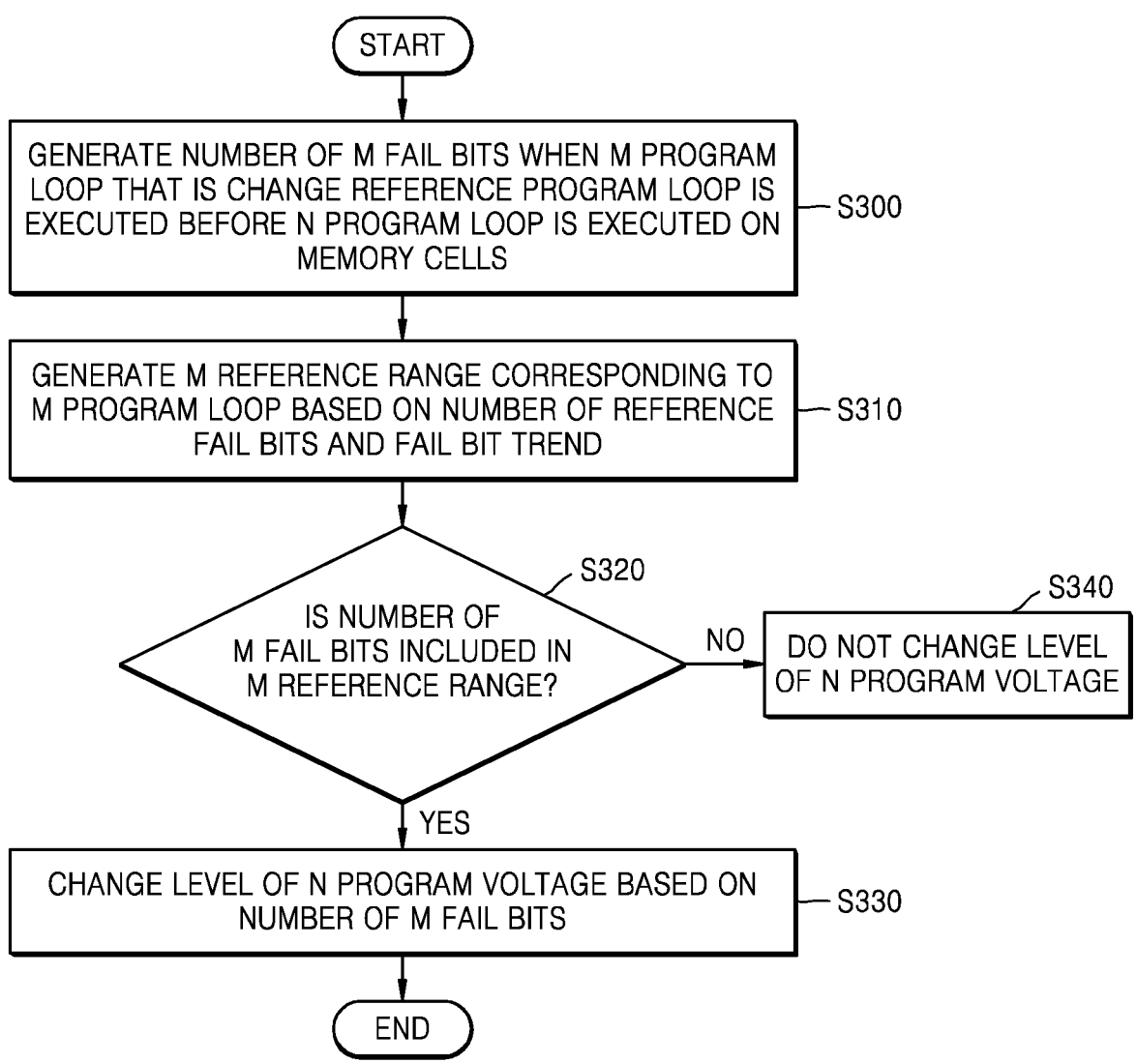
FIG. 18 is a flowchart of a method of changing a program voltage level of a last program loop, according to another embodiment.

FIG. 18 is a flowchart of a method of changing a program voltage level of a last program loop, according to another embodiment.

When an M program loop that is a change standard program loop is executed before an N program loop that is the last program loop is executed on the memory cells, the M number of fail bits are generated in operation S300. An M standard range corresponding to the M program loop is generated using the standard number of fail bits and the fail bit trend in operation S310. At S320, an operation is performed to determine whether the M number of fail bits is included in the M standard range. When the M number of fail bits is included in the M standard range in operation S320 (YES), a level of an N program voltage may be changed using the M number of fail bits. In an embodiment, the level of the N program voltage may set to be the same as or lower than a set voltage level by using the M number of fail bits. When the M number of fail bits is not included in the M standard range, the level of the N program voltage is not changed in operation S340. However, when the M number of fail bits corresponds to a large number of fail bits that are not included in the M standard range, the level of the N program voltage may set to be higher than the set level. Therefore, the number of times that program loops are necessarily executed may decrease.

Figure 19:
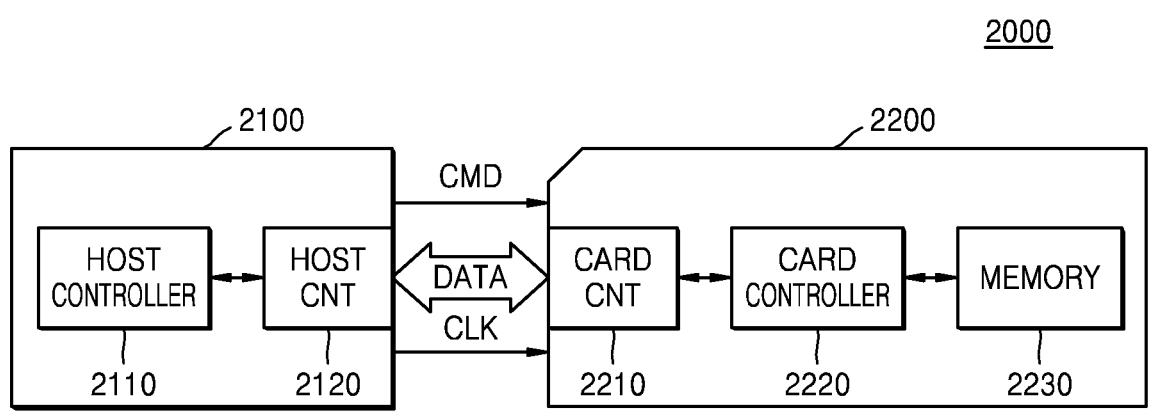
FIG. 19 is a block diagram of a memory card system according to an embodiment.

FIG. 19 is a block diagram of a memory card system 2000 according to an embodiment.

Referring to FIG. 19, the memory card system 2000 may include a host 2100 and a memory card 2200. The host 2100 may include a host controller 2110 and a host connector 2120. The memory card 2200 may include a card connector 2210, a card controller 2220, and a memory 2230.

The host 2100 may write data to the memory card 2200 or may read data stored in the memory card 2200. The host controller 2110 may transmit, to the memory card 2200, a command CMD, a clock signal CLK generated by a clock generator (not shown) included in the host 2100, and data DATA via the host connector 2120.

The card controller 2220 may store the data in the memory 2230 in synchronization with a clock signal generated by a clock generator (not shown) included in the card controller 2220, in response to the command received via the card connector 2210. The memory 2230 may store the data transmitted from the host 2100. The memory 2230 may include the memory device 100 of FIG. 2 described with reference to FIG. 2 and may store, in the memory cell array 110, the data DATA received from the card controller 2220 according to the program method described with reference to FIGS. 1 to 18. Accordingly, reliability of the data DATA stored in the memory cell array 110 may be improved.

The memory card 2200 may be embodied as a Compact Flash Card (CFC), a Microdrive, a Smart Media Card (SMC), a Multimedia Card (MMC), a Security Digital Card (SDC), a Memory Stick, a USB flash memory driver, or the like.

Figure 20:
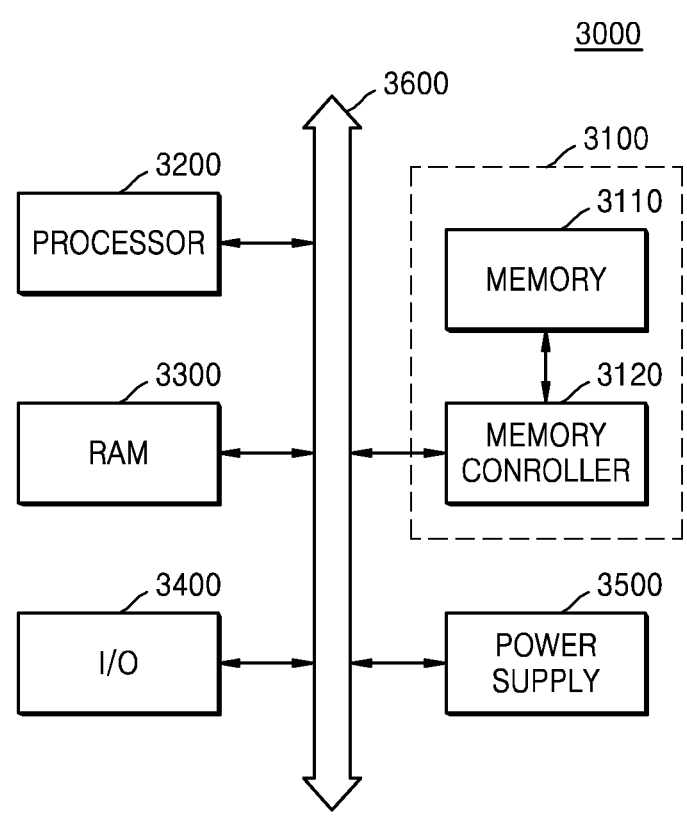
FIG. 20 is a block diagram of a computing system according to an embodiment.

FIG. 20 is a block diagram of a computing system 300 according to an embodiment.

Referring to FIG. 20, the computing system 3000 may include a memory system 3100, a processor 3200, random access memory (RAM) 3300, an input/output (I/O) device 3400, and a power supply 3500. Although not shown in FIG. 19, the computing system 300 may further include ports that may communicate with a video card, a sound card, a memory card, a universal serial bus (USB) device, or the like, or may communicate with other electronic devices. The computing system 300 may be embodied as a personal computer or a portable electronic device such as a laptop computer, a mobile phone, a PDA, or a camera.

The processor 3200 may perform certain calculations or tasks. According to an embodiment, the processor 3200 may be a micro processor or a central processing unit (CPU). The processor 3200 may communicate with the RAM 3300, the I/O device 3400, and the memory system 3100 via a bus 3600 such as an address bus, a control bus, and a data bus. According to an embodiment, the processor 3200 may be connected to an expansion bus such as a peripheral component interconnect (PCI) bus.

The memory system 3100 may communicate with the processor 3200, RAM 3300, and the I/O device 3400 via the bus 3600. The memory system 3100 may store received data or may provide the stored data to the processor 3200, the RAM 3300, or the I/O device 3400, according to requests from the processor 3200. The memory system 3100 may include the memory device 100 described with reference to FIG. 2, and a memory 3110 may store, in a memory cell array, data DATA received from the memory controller 3120 according to a program, according to the embodiments described with reference to FIGS. 1 to 18. Accordingly, reliability of the stored data DATA may be improved.

The RAM 3300 may store data necessary to operate the computing system 300. For example, the RAM 3300 may be embodied as dynamic RAM (DRAM), mobile DRAM, static RAM (SRAM), PRAM, ferroelectrics random access memory (FRAM), RRAM, and/or MRAM.

The I/O device 3400 may include an input device such as a keyboard, a keypad, and a mouse and an output device such as a printer and a display. The power supply 3500 may provide an operating voltage necessary to operate the computing system 3000.

While the concepts described herein have been particularly shown and described with reference to embodiments thereof, it will be understood that various changes in form and details may be made therein without departing from the spirit and scope of the following claims.

What is claimed is:

1. A method of programming a non-volatile memory, the method comprising:
executing at least two program loops on memory cells in a selected word line;
generating a fail bit trend based on a result of executing each of the at least two program loops;
predicting a plurality of program loops comprising an N program loop to be executed last on the memory cells for having a target threshold voltage distribution, based on the generated fail bit trend; and
changing, based on a result of predicting the plurality of program loops, a level of an N program voltage provided to the memory cells when the N program loop is executed.

2. The method of claim 1, wherein the generating of the fail bit trend comprises generating the fail bit trend by using a number of fail bits generated by executing each of the at least two program loops.

3. The method of claim 2, wherein the fail bit trend corresponds to an amount of a change in the number of fail bits generated by executing each of the at least two program loops.

4. The method of claim 1, wherein the predicting of the plurality of program loops comprises:
predicting a number of N fail bits that is lower than a number of reference fail bits, based on the fail bit trend; and
predicting a program loop corresponding to the predicted number of N fail bits as the N program loop.

5. The method of claim 1, wherein the changing of the level of the N program voltage comprises generating a number of M fail bits when an M program loop that is a change reference program loop is executed on the memory cells, and
the level of the N program voltage is changed based on the number of M fail bits.

6. The method of claim 5, wherein the M program loop comprises a program loop that is selected from among the plurality of program loops that are predicted.

7. The method of claim 5, wherein the M program loop comprises an N−1 program loop that is executed immediately sequentially prior to when the N program loop is executed.

8. The method of claim 5, wherein the changing of the level of the N program voltage further comprises generating an M reference range corresponding to the M program loop based on the number of reference fail bits and the fail bit trend, and
the level of the N program voltage is changed based on whether the number of M fail bits is comprised in the M reference range.

9. The method of claim 8, wherein, when the number of M fail bits is comprised in the M reference range, the level of the N program voltage decreases in proportion to a decrease in the number of M fail bits.

10. The method of claim 8, wherein the changing of the level of the N program voltage comprises changing the level of the N program voltage by referring to a voltage level change table, which is set based on the M reference range, and using voltage level change values corresponding to the number of M fail bits.

11. The method of claim 1, further comprising:
determining a fail bit trend generation timing based on at least one of an execution state in which the plurality of program loops are executed on the memory cells and a number of the plurality of program loops executed on the memory cells.

12. A non-volatile memory device, comprising:
a memory cell array comprising a plurality of memory cells that are targeted for program loop execution; and
a controller configured to execute a plurality of program loops on the plurality of memory cells,
wherein the controller comprises:
a fail bit trend generator configured to generate a fail bit trend based on results of executing at least two of the plurality of program loops that are executed on the plurality of memory cells;
a program loop prediction unit configured to predict the plurality of program loops to be executed on the plurality of memory cells based on the fail bit trend; and
a program voltage level controller configured to change a level of a program voltage provided when a last program loop is executed on the plurality of memory cells for having a target threshold voltage distribution, based on a result of predicting the plurality of program loops.

13. The non-volatile memory device of claim 12, wherein the fail bit trend generator is further configured to generate the fail bit trend corresponding to an amount of a change in a number of fail bits that are generated by executing each of the plurality of program loops.

14. The non-volatile memory device of claim 13, wherein the program loop prediction unit is further configured to predict, as the last program loop, a program loop corresponding to the number of fail bits that is predicted to be lower than a number of reference fail bits, based on the fail bit trend.

15. The non-volatile memory device of claim 12, wherein the program voltage level controller is further configured to select a change reference program loop from among the plurality of program loops that are predicted and change the level of the program voltage based on a number of fail bits that are generated by executing the change reference program loop on the plurality of memory cells.

16. A method of programming a non-volatile memory, the method comprising:
executing at least two program loops on memory cells in a selected word line and identifying memory cells with voltage levels below a threshold;
generating, based on a result of executing each of the at least two program loops, a fail bit trend identifying a trend in a number of memory cells identified with voltage levels below the threshold;
projecting a number of program loops comprising an N program loop to be executed last on the memory cells for having a target threshold voltage distribution, based on the generated fail bit trend; and
changing, based on a result of predicting the plurality of program loops, a level of an N program voltage provided to the memory cells when the N program loop is executed.

17. The method of claim 16, wherein the fail bit trend is generated using a number of fail bits in memory cells identified with voltage levels below the threshold.

18. The method of claim 17, wherein the fail bit trend corresponds to an amount of a change in the number of fail bits generated by executing each of the at least two program loops.

19. The method of claim 16, further comprising:
determining a fail bit trend generation timing based on at least one of an execution state in which the plurality of program loops are executed on the memory cells and a number of the plurality of program loops executed on the memory cells.

20. The method of claim 16,
wherein the memory cells are in a memory cell array and are targeted for program loop execution, and
wherein the plurality of program loops on the plurality of memory cells are executed by a controller that is configured to generate the fail bit trend.

\* \* \* \* \*